United States Patent
Kakihara

(10) Patent No.: US 6,663,987 B2
(45) Date of Patent: Dec. 16, 2003

(54) MAGNETORESISTIVE ELEMENT FOR EFFECTIVE SENSING CURRENT FLOWING INTO MULTILAYER FILM, AND PROCESS FOR MANUFACTURING THE SAME

(75) Inventor: Yoshihiko Kakihara, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 329 days.

(21) Appl. No.: 09/725,542

(22) Filed: Nov. 29, 2000

(65) Prior Publication Data

US 2001/0003022 A1 Jun. 7, 2001

(30) Foreign Application Priority Data

Dec. 2, 1999 (JP) ............................................. 11-343050

(51) Int. Cl.[7] .......................... B32B 19/00; G11B 5/127; G11B 5/39
(52) U.S. Cl. ........................ 428/693; 428/632; 428/650; 360/324.12; 360/327.24
(58) Field of Search ................................. 360/128, 313, 360/324.1, 324.11, 324.12, 325, 326, 328, 327.21, FOR 213, 322, 327.24, 327.23, 327.32; 428/611, 693, 694 R, 694 EC, 694 T, 694 TP, 694 BP, 900, 692, 212, 623, 632, 640, 650; 29/603.01

(56) References Cited

U.S. PATENT DOCUMENTS

| | | | |
|---|---|---|---|
| 5,641,557 A | | 6/1997 | Ishiwata |
| 5,852,533 A | * | 12/1998 | Miyauchi et al. ......... 360/324.1 |
| 5,876,843 A | | 3/1999 | Ishiwata |
| 5,923,504 A | * | 7/1999 | Araki et al. ........... 360/324.11 |
| 6,097,579 A | * | 8/2000 | Gill ........................ 360/324.2 |
| 6,128,167 A | * | 10/2000 | Saito et al. ............ 360/324.12 |
| 6,201,673 B1 | * | 3/2001 | Rottmayer et al. .... 360/324.12 |
| 6,292,336 B1 | * | 9/2001 | Horng et al. .......... 360/324.12 |
| 6,587,315 B1 | * | 7/2003 | Aoki et al. ................. 360/322 |

* cited by examiner

Primary Examiner—Stevan A. Resan
Assistant Examiner—Louis Falasco
(74) Attorney, Agent, or Firm—Brinls Hofer Gilson & Lione

(57) ABSTRACT

A magnetoresistive element includes an insulating layer formed between electrode layers, and the electrode layers are formed on a multilayer film so as to be in contact with the sides of the insulating layer. The thickness of the electrode layers can therefore be kept thick even at front end faces and a sensing current can flow into the multilayer film always at a constant level.

48 Claims, 11 Drawing Sheets

MAGNETORESISTIVE ELEMENT FOR EFFECTIVE SENSING CURRENT FLOWING INTO MULTILAYER FILM, AND PROCESS FOR MANUFACTURING THE SAME

BACKGROUND OF THE INVENTION

1. Field of the Invention

The present invention relates to a spin-valve thin film element in which an electric resistance varies with, for example, the magnetization vector in a pinned magnetic layer and the a magnetization vector in a free magnetic layer affected by an external magnetic field. Specifically, the present invention relates to a magnetoresistive element which allows a sensing current to effectively flow into a multilayer film, as well as a process for manufacturing the electromagnetic element.

2. Description of the Related Art

FIG. 14 is a sectional view of the structure of a conventional magnetoresistive element taken from an air bearing surface (ABS).

The magnetoresistive element shown in FIG. 14 is a spin-valve thin film element and detects a recording magnetic field from a recording medium such as a hard disk. The spin-valve thin film element is a type of giant magnetoresistive element utilizing a giant magnetoresistive effect. This type of element.

The spin-valve thin film element includes a multilayer film 9 comprising an underlayer 6, an antiferromagnetic layer 1, a pinned magnetic layer 2, a nonmagnetic layer 3, a free magnetic layer 4, and a protective layer 7 layered in this order from the bottom, and a pair of hard bias layers 5 and 5 formed on both sides of the multilayer film 9, and a pair of electrode layers 8 and 8 formed on the hard bias layers 5 and 5. The underlayer 6 and the protective layer 7 are each made of, for example, a Ta (tantalum) film. The width of a top surface of the multilayer film 9 defines a track width Tw.

Generally, the antiferromagnetic layer 1 is made of an Fe—Mn (iron-manganese) alloy film or a Ni—Mn (nickel-manganese) alloy film, the pinned magnetic layer 2 and the free magnetic layer 4 are each made of a Ni—Fe (nickel-iron) alloy film, the nonmagnetic layer 3 is made of a Cu (copper) film, the hard bias layers 5 and 5 is made of a Co—Pt (cobalt-platinum) alloy film, and the electrode layers 8 and 8 are each made of a Cr (chromium) film.

As shown in FIG. 14, the magnetization vector in the pinned magnetic layer 2 is put into a single magnetic domain state in the Y direction (direction of a leakage magnetic field from a recording medium; height direction) through an exchange anisotropic magnetic field with the antiferromagnetic layer 1. In contrast, the magnetization vector in the free magnetic layer 4 is aligned in the X direction by the effect of a bias magnetic field from the hard bias layers 5 and 5.

Specifically, the magnetization vector in the pinned magnetic layer 2 is set so as to be orthogonal to the magnetization vector in the free magnetic layer 4.

In the spin-valve thin film element, the electrode layers 8 and 8 formed on the hard bias layers 5 and 5 supply a sensing current to the pinned magnetic layer 2, the nonmagnetic layer 3 and the free magnetic layer 4. The magnetic recording medium, such as a hard disk, moves in the Z direction. When a leakage magnetic field from the magnetic recording medium is applied to the free magnetic layer 4 in the Y direction, the magnetization vector in the free magnetic layer 4 varies from the X direction to the Y direction. The electrical resistance depends on the variation in the magnetization vector in the free magnetic layer 4 and the magnetization vector in the pinned magnetic layer 2 (this is called as "magnetoresistive effect"), hence the leakage magnetic field from the magnetic recording medium is detected by the variation in the voltage due to the variation in the electrical resistance.

However, the conventional magnetoresistive element shown in FIG. 14 has the following problems.

The electrode layers 8 and 8 of the magnetoresistive element shown in FIG. 14 have a decreasing thickness as they approach to front end faces 8a and 8a which are in contact with the multilayer film 9. A sensing current at a constant level cannot be always significantly allowed to flow even to the front end faces 8a and 8a of the electrode layers 8 and 8, and the sensing current is shunted on the way, part of which flows into the hard bias layers 5 and 5, to thereby reduce a read output.

SUMMARY OF THE INVENTION

Accordingly, it is an object of the present invention to provide a magnetoresistive element free from the above problems, in which electrode layers have some thickness even in regions where the electrode layers are in contact with a multilayer film and thereby can allow a sensing current to flow into a multilayer film of the magnetoresistive element always at a constant level to improve the reproducing characteristics, as well as to provide a process for manufacturing the magnetoresistive element.

Specifically, the present invention provides, in an aspect, a magnetoresistive element which includes a multilayer film including an antiferromagnetic layer, a pinned magnetic layer formed in contact with the antiferromagnetic layer, the magnetization vector in the pinned magnetic layer is fixed by an exchange anisotropic magnetic field with the antiferromagnetic layer, and a free magnetic layer formed on the pinned magnetic layer through the interposition of a nonmagnetic layer; a pair of bias layers formed on both sides of the multilayer film and aligning the magnetization vector in the free magnetic layer to a direction crossing the magnetization vector of the pinned magnetic layer; and a pair of electrode layers formed on the bias layers and supplying a sensing current to the pinned magnetic layer, the nonmagnetic layer and the free magnetic layer. In this element, an insulating layer is formed on the multilayer film between the electrode layers, and the electrode layers formed on both sides of the multilayer film are in contact with the sides of the insulating layer directly or through the interposition of another layer.

According to the present invention, front end faces of the electrode layers on the multilayer film side are laminated so as to be along the sides of the insulating layer, and the electrode layers have a large thickness even in regions where the electrode layers are in contact with the multilayer film, owing to the thickness of the insulating layer. Accordingly, a sensing current can be allowed to flow in the multilayer film of the magnetoresistive element always at a constant level to thereby improve the reproducing characteristics.

Preferably, the multilayer film includes a lamination of the antiferromagnetic layer, the pinned magnetic layer, the nonmagnetic layer, and the free magnetic layer in this order from the bottom, and the antiferromagnetic layer extends toward the portions on both sides of each of the layers formed on the antiferromagnetic layer, and a pair of the bias layers and a pair of the electrode layers are laminated on the antiferromagnetic layer in the portions on both sides through the interposition of a metallic film.

The present invention provides, in another aspect, a magnetoresistive element which includes a multilayer film including a free magnetic layer, nonmagnetic layers formed on and under the free magnetic layer, pinned magnetic layers formed on one nonmagnetic layer and under the other nonmagnetic layer where magnetization vectors in the pinned magnetic layers are fixed, and antiferromagnetic layers formed on one pinned magnetic layer and under the other pinned magnetic layer; a pair of bias layers formed on both sides of the multilayer film and aligning the magnetization vector in the free magnetic layer in a direction crossing the magnetization vectors in the pinned magnetic layers; a pair of electrode layers formed on the bias layers and supplying a sensing current to the pinned magnetic layers, the nonmagnetic layers, and the free magnetic layer. In the magnetoresistive element, an insulating layer is formed on the multilayer film between the electrode layers, and the electrode layers formed on both sides of the multilayer film are in contact with sides of the insulating layer directly or through the interposition of another layer.

An antioxidant protective layer may be formed on a top surface of the multilayer film.

A surface of the protective layer or a surface of the multilayer film other than the protective layer may preferably form an angle of 60 degrees or more, and more preferably of 90 degrees or more with respect to front end faces of the electrode layers extending over a dead zone of the multilayer film. By this configuration, a sensing current can be surely allowed to flow even into the front end faces of the electrode layers always at a constant level.

Preferably, the free magnetic layer includes plural soft magnetic thin films which have different magnetic moments and are laminated with each other through the interposition of a nonmagnetic material layer, and the free magnetic layer is in a ferrimagnetic state where the magnetization vectors of a pair of the soft magnetic thin films adjacent to each other through the interposition of the nonmagnetic material layer are in parallel with and opposite to each other. By this configuration, equivalent advantages to the case where the thickness of the free magnetic layer is thinned can be obtained, and the magnetization of the free magnetic layer becomes apt to vary to thereby improve magnetic field detecting (sensing) sensitivity of the magnetoresistive element.

The magnitude of the magnetic moment of the soft magnetic thin film is represented as the product of the saturation magnetization (Ms) and the thickness (t) of the soft magnetic thin film.

When the free magnetic layer includes plural soft magnetic thin films which have different magnetic moments and are laminated with each other through the interposition of a nonmagnetic material layer, a magnetic interface between the multilayer film and the bias layer preferably overlays a side of only one soft magnetic thin film, of sides of the plural soft magnetic thin films constituting the free magnetic layer.

The bias layer has only to align the magnetization vector in one soft magnetic thin film, of the plural soft magnetic thin films constituting the free magnetic layer. When the magnetization vector in one soft magnetic thin film is aligned in a fixed direction, a soft magnetic thin film adjacent to the aforementioned soft magnetic thin film is put into a ferrimagnetic state in which the magnetization vectors in the two layers are in parallel with and opposite to each other, and ultimately, the magnetization vectors of all the soft magnetic thin films are aligned in parallel in the same or opposite direction, and hence the magnetization vector in the overall free magnetic layer is aligned in a fixed direction.

If the bias layer is magnetically connected with the plural soft magnetic thin films constituting the free magnetic layer, the magnetic orientations of such soft magnetic thin films, which are in the opposite direction to the orientation of a magnetic field produced from the bias layer, are disturbed in the vicinity of both side portions where the soft magnetic thin films are magnetically connected with the bias layer. In this case, the magnetization vectors of soft magnetic thin films in the vicinity of the both side portions, which orientations are oriented in a direction of a magnetic field produced from the bias layer, are also disturbed by the effect of the above disturbance.

In addition, the pinned magnetic layer preferably includes plural soft magnetic thin films having different magnetic moments and laminated with each other through the interposition of a nonmagnetic material layer, and the pinned magnetic layer is preferably in a ferrimagnetic state where the magnetization vectors in a pair of the soft magnetic thin films being adjacent to each other through the interposition of the nonmagnetic material layer are in parallel with and opposite to each other. By this configuration, the plural soft magnetic thin films constituting the pinned magnetic layer serve to fix the magnetization vectors of the other soft magnetic thin films to thereby stabilize the magnetization vector in the overall pinned magnetic layer in a fixed direction.

The magnitude of the magnetic moment of the soft magnetic thin film in this case is also represented by the product of the saturation magnetization (Ms) and the thickness (t) of the soft magnetic thin film.

The nonmagnetic material layer is preferably made of one metal or of an alloy of two or more metals selected from Ru, Rh, Ir, Cr, Re, and Cu.

In the invented magnetoresistive element, the antiferromagnetic layer is preferably made of a Pt—Mn alloy, an X—Mn alloy, wherein X is at least one element selected from Pd, Ir, Rh, and Ru, or a Pt—Mn—X' alloy, wherein X' is at least one element selected from Pd, Ir, Rh, Ru, Au, and Ag.

In a further aspect, the present invention provides a magnetoresistive element which includes a multilayer film including a magnetoresistive layer, a nonmagnetic layer, and a soft magnetic layer laminated in this order; a pair of bias layers formed on both sides of the multilayer film; and a pair of electrode layers formed on the bias layers. In this magnetoresistive element, an insulating layer is formed on the multilayer film between the electrode layers, and the electrode layers formed on both sides of the multilayer film are in contact with the sides of the insulating layer directly or through the interposition of another layer.

In the invented magnetoresistive element, the height of an upper edge and/or a lower edge of a magnetic interface between the multilayer film and the bias layer in a medium moving direction is preferably equal to the height of an upper side and/or a lower side of the free magnetic layer or the magnetoresistive layer in a medium moving direction.

The bias layer is magnetically connected with a side of the multilayer film in a track width direction directly or through the interposition of another layer such as an underlayer. The bias layer serves to align the magnetization vector in the free magnetic layer or of the magnetoresistive layer in a fixed direction. Accordingly, the bias layer has only to be magnetically connected with the free magnetic layer or the magnetoresistive layer alone. More preferably, the bias layer is not magnetically connected with the pinned magnetic layer to thereby suppress a magnetic field generated from the bias layer from affecting the magnetization vector in the pinned magnetic layer.

Preferably, the multilayer film includes a sensing region at the center and dead zones on both sides of the sensing region, the sensing region has a satisfactory reproducing sensitivity and is capable of substantially exhibiting a magnetoresistive effect, and the dead zones have a poor reproducing sensitivity and are not capable of substantially exhibiting a magnetoresistive effect, and the electrode layers formed on both sides of the multilayer film extend over the dead zones in the multilayer film.

In the conventional magnetoresistive element, the magnetization vector in the pinned magnetic layer is put into a single magnetic domain state and is fixed in a direction (the Y direction in FIG. 14) out of an opposite face of the recording medium, whereas the hard bias layers magnetized in a track width direction (the X direction in FIG. 14) are formed on both sides of the pinned magnetic layer. By this configuration, the magnetization vectors in the pinned magnetic layer at both ends are put into the track width direction by the effect of a bias magnetic field from the hard bias layers.

Specifically, by effect of magnetization of the hard bias layers in the track width direction, the magnetization vector in the fee magnetic layer which is put into a single magnetic domain state in the track width direction is not orthogonal to the magnetization vector in the pinned magnetic layer particularly in the vicinity of the side ends of the multilayer film. The reproducing sensitivity is thus decreased and an output waveform with a satisfactory symmetry cannot be obtained.

In addition, the magnetization vector in the free magnetic layer in the vicinity of its side end is significantly affected by a strong magnetization from the hard bias layer, and is apt to be fixed, and the magnetization becomes hard to vary with an external magnetic field.

Accordingly, dead zones having a poor reproducing sensitivity are formed in the vicinity of the side ends of the multilayer film, and, a central region of the multilayer film other than the dead zones constitutes a sensing region which substantially contributes reproduction of a recorded magnetic field and exhibits a magnetoresistive effect (FIG. 14).

According to the present invention, the electrode layers formed on both sides of the multilayer film extend over the dead zones of the multilayer film, and the sensing current from the electrode layers is resistant to flow into the hard bias layer. Accordingly, an increased proportion of the sensing current can flow directly into the multilayer film without the interposition of the hard bias layer, and the hard bias layer is in contact with the electrode layers with an increased area to reduce a direct current resistance (DCR) to thereby improve the reproducing characteristics.

Such electrode layers extending over the dead zone can prevent the sensing current from flowing into the dead zone and from producing noises.

The sensing region of the multilayer film may be defined as a region which yields an output of 50% or more of the maximum read output, and the dead zones of the multilayer film may be defined as regions which are on both sides of the sensing region and yield an output less than 50% of the maximum read output, as determined by allowing a magnetoresistive element including electrode layers formed only on both sides of the multilayer film to scan on a microtrack with a recorded signal in a track width direction.

When the protective layer is formed on a top surface of the multilayer film, it is preferably formed on the multilayer film in a portion which is not joined with the electrode layers.

Preferably, the sensing region of the multilayer film has an equal width to an optical read track width O-Tw.

The width of each of the electrode layers in a portion extending over the multilayer film is preferably more than 0 $\mu$m and equal to or less than 0.08 $\mu$m, and more preferably equal to or more than 0.05 $\mu$m and equal to or less than 0.08 $\mu$m.

The invented magnetoresistive element is preferably manufactured by the following process so that a side of the multilayer film becomes in parallel with a side of the insulating layer.

In yet another aspect, the present invention provides a process for manufacturing a magnetoresistive element which includes a step of forming a multilayer film on a substrate, the multilayer film exhibits a magnetoresistive effect; a step of forming an insulating layer on the multilayer film; a step of forming a resist layer for lift-off on the insulating layer; a step of forming bias layers on both sides of the multilayer film and magnetizing the formed bias layers in a track width direction; a step of forming electrode layers from an oblique direction with respect to the multilayer film, where each of the electrode layers is formed in contact with a side of the insulating layer directly or through the interposition of another layer, and the insulating layer underlies the resist layer; and a step of removing the resist layer from above the insulating layer.

The process preferably further includes a step of forming an antioxidant protective layer on a top surface of the multilayer film in the step of forming the multilayer film exhibiting a magnetoresistive effect on the substrate.

In the step of forming electrode layers, a surface of the protective layer or a surface of the multilayer film other than the protective layer forms an angle of preferably 60 degrees or more, and more preferably 90 degrees or more, with respect to front end faces of the electrode layers extending over dead zones of the multilayer film.

In the step of forming the resist layer for lift-off on the insulating layer, the resist layer preferably has an incision at the bottom facing a region of the multilayer film, which region is to be a dead zone being previously determined by microtrack profiling and the resist layer is formed on the insulating layer in a region above a sensing region of the multilayer film, and the process preferably further includes a step of etching to thereby remove the insulating layer even inside the incision formed at the bottom of the resist layer. By this configuration, the electrode layers can extend over the dead zones of the multilayer film in the step of forming the electrode layers.

In this connection, the sensing region of the multilayer film determined by microtrack profiling may be defined as a region which yields an output of 50% or more of the maximum read output, and the dead zones of the multilayer film may be defined as regions which are on both sides of the sensing region and yield an output less than 50% of the maximum read output, as determined by allowing a magnetoresistive element including electrode layers formed only on both sides of the multilayer film to scan on a microtrack with a recorded signal in a track width direction.

When the antioxidant protective layer is formed on a top surface of the multilayer film in the step of forming the multilayer film exhibiting a magnetoresistive effect on the substrate, the process may preferably further include a step of removing a region of the protective layer being not covered by the insulating layer to expose a layer underlying the protective layer subsequent to the step of etching to thereby remove the insulating layer even inside the incision formed at the bottom of the resist layer.

In the invented process, preferably, the substrate with the formed multilayer film is placed in a direction perpendicular to a target having a composition of the bias layers, and the bias layers are formed on both sides of the multilayer film by at least one sputtering process selected from ion beam sputtering, long-throw sputtering and collimation sputtering, and subsequently, the substrate with the formed multilayer film is placed in an oblique direction with respect to a target having a composition of the electrode layers or the target is placed in an oblique direction with respect to the substrate, and films of the electrode layers are formed on the bias layer even inside an incision formed at the bottom of the resist layer on the multilayer film, by at least one sputtering process selected from ion beam sputtering, long-throw sputtering and collimation sputtering.

The multilayer film preferably includes at least one each of an antiferromagnetic layer, a pinned magnetic layer, a nonmagnetic layer, and a free magnetic layer, or includes a free magnetic layer, and combinations of a nonmagnetic layer, a pinned magnetic layer, and an antiferromagnetic layer on and under the free magnetic layer, or includes a magnetoresistive layer, a nonmagnetic layer, and a soft magnetic layer laminated in this order.

The free magnetic layer is preferably formed so as to include plural soft magnetic thin films having different magnetic moments and being laminated with each other through the interposition of a nonmagnetic material layer, and the free magnetic layer is preferably in a ferrimagnetic state where the magnetization vectors of a pair of the soft magnetic thin films being adjacent to each other through the interposition of the nonmagnetic material layer are in parallel with and opposite to each other.

When the free magnetic layer is formed so as to include plural soft magnetic thin films having different magnetic moments and being laminated with each other through the interposition of a nonmagnetic material layer, a magnetic interface between the multilayer film and the bias layer is preferably allowed to overlay a side of only one soft magnetic thin film, of sides of the plural soft magnetic thin films constituting the free magnetic layer, in the step of forming the bias layers.

Preferably, the pinned magnetic layer is formed so as to include plural soft magnetic thin films having different magnetic moments and being laminated with each other through the interposition of a nonmagnetic material layer, and the pinned magnetic layer is in a ferrimagnetic state where the magnetization vectors in a pair of the soft magnetic thin films adjacent to each other through the interposition of the nonmagnetic material layer are in parallel with and opposite to each other.

The nonmagnetic material layer is preferably made of one metal or an alloy of two or more metals selected from Ru, Rh, Ir, Cr, Re, and Cu.

In the step of forming the bias layers, the height of an upper edge and/or a lower edge of a magnetic interface between the multilayer film and the bias layer in a medium moving direction is preferably set at equal to the height of an upper side and/or a lower side of the free magnetic layer or the magnetoresistive layer in a medium moving direction.

According to the present invention, the antiferromagnetic layer is preferably made of a Pt—Mn alloy. Alternatively, the antiferromagnetic layer may be made of an X—Mn alloy, wherein X is at least one element selected from Pd, Ir, Rh, and Ru, or may be made of a Pt—Mn—X' alloy, wherein X' is at least one element selected from Pd, Ir, Rh, Ru, Au, and Ag.

In the step of etching to thereby remove the insulating layer even inside the incision formed at the bottom of the resist layer, the insulating layer may be etched in such a manner that the sides of the insulating layer are kept in parallel with the sides of the multilayer film.

If the width of the top surface of the multilayer composed of, for example, an antiferromagnetic layer, a pinned magnetic layer, a nonmagnetic layer, and a free magnetic layer laminated in this order is defined as a track width Tw, the overall multilayer film does not actually exhibit a magnetoresistive effect. The central region of the multilayer film alone has a satisfactory reproducing sensitivity, and substantially the central region alone can exhibit the magnetoresistive effect. The region of the multilayer film having a satisfactory reproducing sensitivity is called as a sensing region and the region having a poor reproducing sensitivity is called as a dead zone. The sensing region and dead zones occupying the multilayer film are determined according to microtrack profiling technique. The microtrack profiling technique will be described below, with reference to FIG. 13.

Initially, a conventional magnetoresistive element (FIG. 14) is formed on a substrate, which magnetoresistive element includes a multilayer film exhibiting a magnetoresistive effect, hard bias layers formed on both sides of the multilayer film, and electrode layers formed on the hard bias layers, as shown in FIG. 13. The electrode layers are formed only on both sides of the multilayer film.

Next, the width A of a top surface of the multilayer film in a portion not covered by the electrode layers is determined with an optical microscope. The width A is defined as a track width Tw which is determined by an optical technique (hereinafter referred to as "optical read track width O-Tw").

A signal is then recorded on a microtrack on a recording medium, and the magnetoresistive element is allowed to scan on the microtrack in the track width direction to thereby determine the relation between the width A of the multilayer film and a read output. Alternatively, the recording medium with the formed microtrack is allowed to scan on the magnetoresistive element in the track width direction to thereby determine the relation between the width A of the multilayer film and a read output. The result thereof is shown in a lower side of FIG. 13.

The result shows that the read output is high around the center of the multilayer film and is low in the vicinity of the periphery of the multilayer film, indicating that the central region of the multilayer film exhibits a satisfactory magnetoresistive effect to contribute a reproducing function, whereas the peripheral region thereof exhibits a deteriorated magnetoresistive effect and has a low read output and exhibits a decreased reproducing function.

In the present invention, a region having a width B on a top surface of the multilayer film, which yields an output of 50% or more of the maximum read output is defined as a sensing region, and a region having a width C on a top surface of the multilayer film, which yields an output less than 50% of the maximum read output is defined as a dead zone.

In the dead zone, the reproducing function does not effectively act and serves only to increase a direct current resistance (DCR). According to the present invention, the electrode layers therefore extend even over the dead zone to thereby increase junction areas between the hard bias layers and the electrode layers formed on both sides of the multilayer film and to facilitate a sensing current from the electrode layers to flow into the multilayer film without the interposition of the hard bias layers. The direct current resistance can therefore be reduced to thereby improve the reproducing characteristics.

DESCRIPTION OF THE PREFERRED EMBODIMENTS

Figure 1:
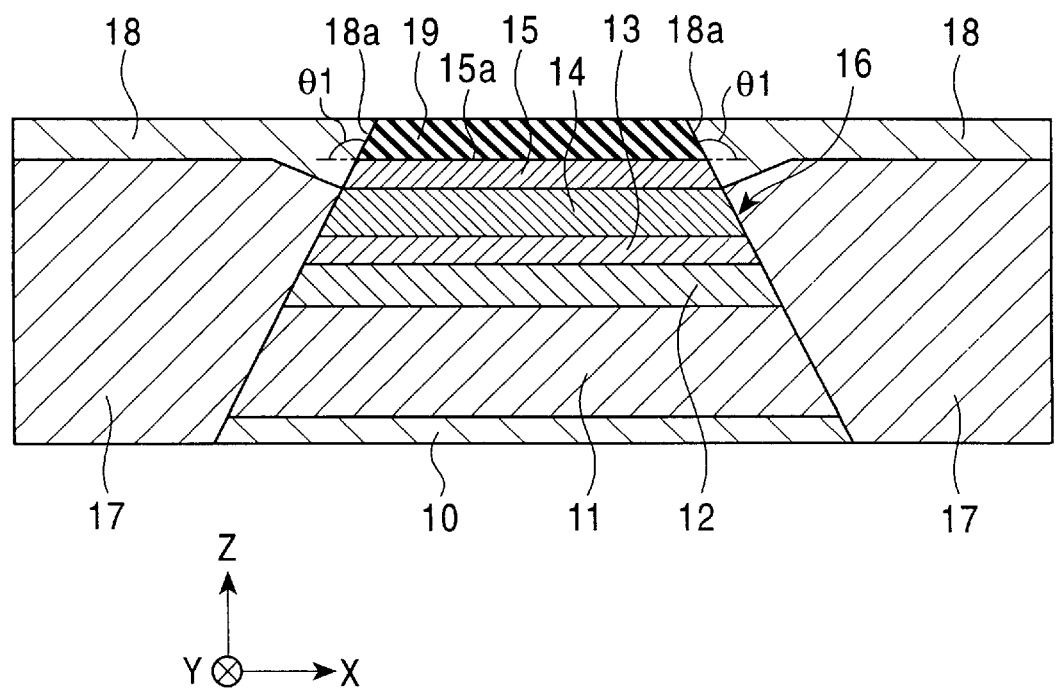
FIG. 1 is a local sectional view showing the structure of a magnetoresistive element as a first embodiment of the present invention.

FIG. 1 is a sectional view showing the structure of a magnetoresistive element as a first embodiment of the invention, taken from ABS side. In FIG. 1, the central portion alone of the element extending in the X direction is illustrated as a sectional view.

The magnetoresistive element is a spin-valve thin film element and is a type of GMR (giant magnetoresistive) elements utilizing a giant magnetoresistive effect. The spin-valve thin film element is supported by, for example, the trailing end of a floating slider provided in a hard disk drive and detects a recording magnetic field from a recording medium such as a hard disk. The magnetic recording medium moves in the Z direction and the leakage magnetic field from the magnetic recording medium is in the Y direction.

In FIG. 1, an underlayer 10 is formed of a nonmagnetic material such as tantalum (Ta) as an undermost layer. An antiferromagnetic layer 11, a pinned magnetic layer 12, a nonmagnetic layer 13 composed of a conductive material, and a free magnetic layer 14 are laminated on the underlayer 10. A protective layer 15 is formed from, for example, tantalum Ta on the free magnetic layer 14. The individual layers from the underlayer 10 to the protective layer 15 constitute a multilayer film 16.

The pinned magnetic layer 12 is formed in contact with the antiferromagnetic layer 11. When the antiferromagnetic layer 11 and the pinned magnetic layer 12 formed thereon are annealed in a given magnetic field, an exchange anisotropic magnetic field is generated through exchange coupling at the interface between the two layers to thereby fix the magnetization vector in the pinned magnetic layer 12 in the Y direction.

In the present embodiment, the antiferromagnetic layer 11 is made of a Pt—Mn (platinum-manganese) alloy film. The Pt—Mn alloy film has a higher corrosion resistance, a higher blocking temperature, and a greater exchange anisotropic magnetic field (Hex) than an Fe—Mn alloy film or a Ni—Mn alloy film conventionally used as an antiferromagnetic layer. The Pt—Mn alloy film has therefore satisfactory characteristics as an antiferromagnetic material.

Alternatively, the antiferromagnetic layer 11 may be made of an X—Mn alloy, wherein X is at least one element selected from Pd, Ir, Rh, and Ru, or a Pt—Mn—X' alloy, wherein X' is at least one element selected from Pd, Ir, Rh, Ru, Au, and Ag, instead of the Pt—Mn alloy.

The pinned magnetic layer 12 and the free magnetic layer 14 are each made of, for example, a Ni—Fe (nickel-iron) alloy, Co (cobalt), an Fe—Co (iron-cobalt) alloy, or an Fe—Co—Ni alloy. The nonmagnetic conductive layer 13 is made of Cu (copper) or another nonmagnetic conductive material having a low electric resistance.

As shown in FIG. 1, hard bias layers 17 and 17 are formed on both sides of the multilayer film 16 in the portions from the underlayer 10 to the free magnetic layer 14. The hard bias layers 17 and 17 are each made of, for example, a Co—Pt (cobalt-platinum) alloy or a Co—Cr—Pt (cobalt-chromium-platinum) alloy.

The magnetization vector in the free magnetic layer 14 is aligned in the X direction by the effect of a bias magnetic field in the X direction from the hard bias layers 17 and 17 which are magnetized in the X direction (track width direction).

In the magnetoresistive element shown in FIG. 1, an insulating layer 19 made of, for example, $Al_2O_3$ is laminated on the multilayer film 16, and front end faces 18a and 18a of the electrode layers 18 and 18 are in contact with the both sides of the insulating layer 19.

According to this embodiment of the present invention, the front end faces 18a and 18a of the electrode layers 18 and 18 on the multilayer film 16 side are laminated so as to be along the sides of the insulating layer 19, and the thickness of the electrode layers 18 and 18 is kept thick even in regions where the electrode layers 18 and 18 are in contact with the multilayer film 16, owing to the thickness of the insulating layer 19. A sensing current can therefore be allowed to flow in the multilayer film 16 of the magnetoresistive element always at a constant level to thereby improve the reproducing characteristics.

In the embodiment shown in FIG. 1, the angle θ1 formed between the front end face 18a of the electrode layer 18 and the surface 15a (or a plane extending from the surface 15a) of the protective layer 15 may be preferably set at 60 degrees or more, and more preferably at 90 degrees or more, which front end face 18a is in contact with the portions at both sides of the insulating layer 19, and which electrode layer 18 extends over a dead zone of the multilayer film 16. By this configuration, a sensing current can be allowed to flow even to the end of the electrode layer 18 always at a constant level. Specifically, the production of noises due to the sensing current separated and flown into the dead zone can be inhibited.

Figure 2:
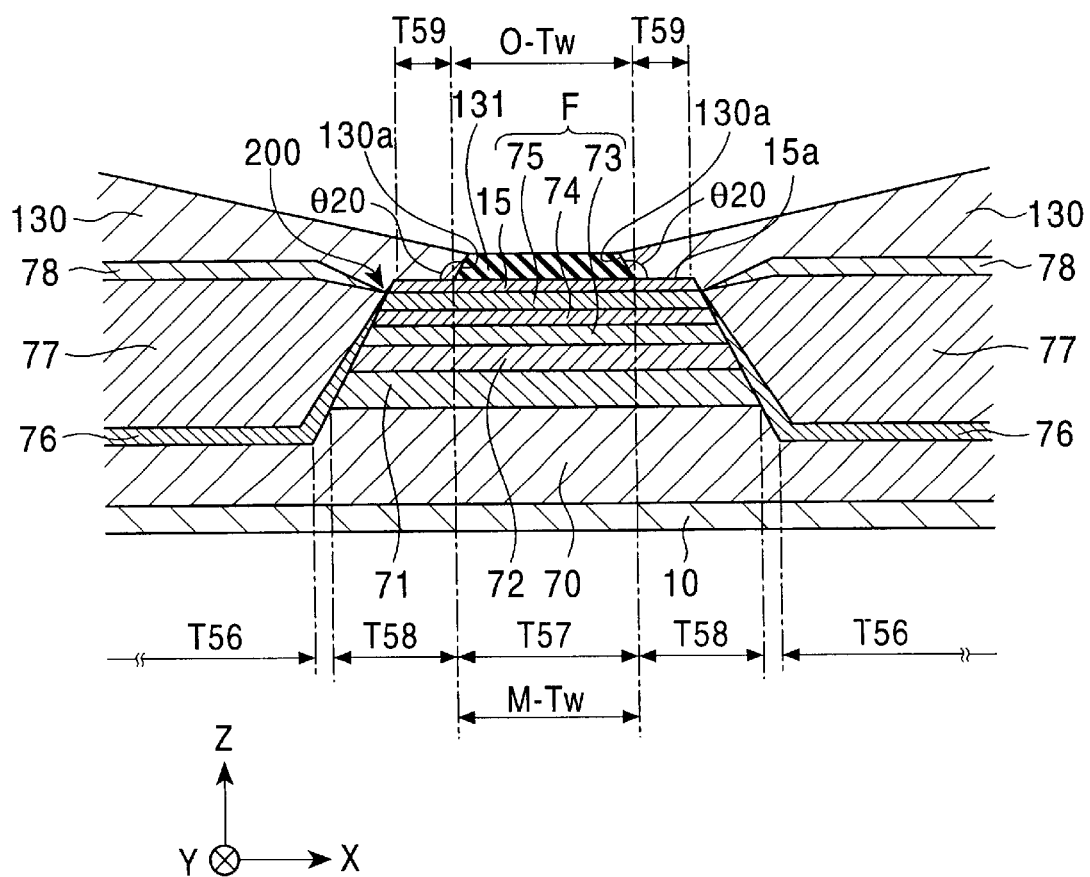
FIG. 2 is a local sectional view showing the structure of a magnetoresistive element as a second embodiment of the present invention.

FIG. 2 is a sectional view showing the structure of another invented magnetoresistive element taken from ABS side.

A spin-valve thin film element shown in FIG. 2 includes an antiferromagnetic layer 70 formed on an underlayer 10. The antiferromagnetic layer 70 extends long in the X direction and protrudes at the center in the X direction. A pinned magnetic layer 71, a nonmagnetic layer 72 composed of a conductive material, a first free magnetic layer 73, a nonmagnetic material layer 74, a second free magnetic layer 75, and a protective layer 15 are formed in this order on the protruded portion of the antiferromagnetic layer 70. Thus, a laminate from the underlayer 10 to the protective layer 15 constitutes a multilayer film 200.

The pinned magnetic layer 71 is formed in contact with the antiferromagnetic layer 70. When the antiferromagnetic layer 70 and the pinned magnetic layer 71 are annealed in a given magnetic field, an exchange anisotropic magnetic field is generated through exchange coupling at the interface between the two layers to thereby fix the magnetization vector in the pinned magnetic layer 71 in the Y direction.

In the present embodiment, the antiferromagnetic layer 70 is made of a Pt—Mn (platinum-manganese) alloy film. Alternatively, the antiferromagnetic layer 70 may be made of an X—Mn alloy, wherein X is at least one element selected from Pd, Ir, Rh, and Ru, or a Pt—Mn—X' alloy, wherein X' is at least one element selected from Pd, Ir, Rh, Ru, Au, and Ag, instead of the Pt—Mn alloy.

The pinned magnetic layer 71, the first free magnetic layer 73, and the second free magnetic layer 75 are each made of, for example, a Ni—Fe (nickel-iron) alloy, Co (cobalt), an Fe—Co (iron-cobalt) alloy, or an Fe—Co—Ni alloy.

The nonmagnetic layer 72 is made of Cu (copper) or another nonmagnetic conductive material having a low electric resistance.

As shown in FIG. 2, metal films 76 and 76 made of, for example, Cr and serving as buffer films and orienting films are formed on the portions of the width T56 of the antiferromagnetic layer 70 extending in the X direction and on both slanted side faces of the laminate structure including the pinned magnetic layer 71, the nonmagnetic layer 72, the first free magnetic layer 73, the nonmagnetic material layer 74, and the second free magnetic layer 75. The formation of the metal films 76 and 76 can increase a bias magnetic field generated from hard bias layers 77 and 77 mentioned below.

The hard bias layers 77 and 77 made of, for example, a Co—Pt (cobalt-platinum) alloy or a Co—Cr—Pt (cobalt-chromium-platinum) alloy are formed on the metal films 76 and 76.

In addition, intermediate layers 78 and 78 each made of a nonmagnetic material such as Ta (tantalum) are formed on the hard bias layers 77 and 77, and electrode layers 130 and 130 made of, for example, Cr, Au, Ta, or W are formed on the intermediate layers 78 and 78.

The magnetoresistive element shown in FIG. 2 also includes an insulating layer 131 made of, for example, $Al_2O_3$ laminated on the multilayer film 200, and front end faces 130a and 130a of electrode layers 130 and 130 are in contact with the both sides of the insulating layer 131.

According to the present embodiment, the front end faces 130a and 130a of the electrode layers 130 and 130 on the multilayer film 200 side are laminated so as to be along the sides of the insulating layer 131, and the thickness of the electrode layers 130 and 130 is kept thick even in regions where the electrode layers 130 and 130 are in contact with the multilayer film 200, owing to the thickness of the insulating layer 131. A sensing current can therefore be allowed to flow in the multilayer film 200 of the magnetoresistive element always at a constant level to thereby improve the reproducing characteristics.

By manufacturing the magnetoresistive element shown in FIG. 2 by a process mentioned below, the sides of the multilayer film 200 are put in parallel with the sides of the insulating layer 131 in the magnetoresistive element.

According to the embodiment shown in FIG. 2, the antiferromagnetic layer 70 extends even under the hard bias layers 77 and 77, and the hard bias layers 77 and 77 can have a reduced thickness. Accordingly, the hard bias layers 77 and 77 can be easily formed by, for example, sputtering.

The first free magnetic layer 73 and the second free magnetic layer 75 are to have different magnetic moments from each other. The magnetic moment is represented by the product of the saturation magnetization (Ms) and the thickness (t), and the first free magnetic layer 73 and the second free magnetic layer 75 can have different magnetic moments from each other by, for example, preparing the two layers from the same material and allowing the two layers to have different thickness from each other.

The nonmagnetic material layer 74 lying between the first free magnetic layer 73 and the second free magnetic layer 75 is made of one metal or an alloy of two or more metals selected from Ru, Rh, Ir, Cr, Re, and Cu.

In the embodiment shown in FIG. 2, a laminate including the first free magnetic layer 73 and the second free magnetic layer 75 having different magnetic moments from each other through the interposition of the nonmagnetic material layer 74 acts as one free magnetic layer F.

The first free magnetic layer 73 and the second free magnetic layer 75 are put in a ferrimagnetic state where the magnetization vectors in the two layers are in parallel with and opposite to each other. In this case, the magnetization vector in one layer having a greater magnetic moment, for example the first free magnetic layer 73, is oriented in the direction of a magnetic field generated from the hard bias layers 77 and 77, and the magnetization vector in the other layer, for example the second free magnetic layer 75, is oriented in a 180-degree opposite direction to the magnetization vector in the former layer.

As the first free magnetic layer 73 and the second free magnetic layer 75 are put into a ferrimagnetic state where the magnetization vectors in the two layers are in parallel with and opposite to each other, equivalent advantages to the case where the thickness of the free magnetic layer F is reduced can be obtained. Accordingly, the magnetization vector in the free magnetic layer F becomes apt to vary to thereby improve the magnetic field detecting sensitivity of the magnetoresistive element.

The orientation of a synthetic magnetic moment as the sum of the magnetic moment of the first free magnetic layer 73 and that of the second free magnetic layer 75 is the magnetization vector in the free magnetic layer F.

The hard bias layers 77 and 77 are magnetized in the X direction (track width direction), and the magnetization vector in the free magnetic layer F is oriented in the X direction by the effect of a bias magnetic field in the X direction generated from the hard bias layers 77 and 77.

However, the free magnetic layer F may have a single-layer structure of a soft magnetic thin film, as shown in FIG. 1.

With reference to FIG. 2, the region with a width T57 at the center of the multilayer film 200 is a sensing region E, and the regions with a width T58 on both sides of the sensing region are dead zones D and D.

In the sensing region E, the magnetization vector in the pinned magnetic layer 71 is properly fixed in the Y direction, and the magnetization vector in the free magnetic layer F is properly aligned in the X direction. Specifically, the magnetization vectors of the two layers are perpendicular to each other. The magnetization vector in the free magnetic layer F therefore sensitively varies with an external magnetic field from a recording medium. The electrical resistance depends on the variation in the magnetization vector in the free magnetic layer F and the fixed magnetization vector in the pinned magnetic layer 71, hence the leakage magnetic field from the recording medium is detected by the variation in the voltage due to the variation in the electrical resistance.

The sensing region E of the multilayer film 200 is a portion substantially exhibiting a magnetoresistive effect where the reproducing function satisfactorily acts.

In contrast, in the dead zones D and D on both sides of the sensing region E, the magnetization vectors of the pinned magnetic layer 71 and the free magnetic layer F are strongly affected by the magnetization vector in the hard bias layers 77 and 77, and the magnetization vectors in the vicinity of the portions at both ends of the free magnetic layer F are disturbed without aligning in the X direction. Specifically, the dead zones D and D exhibit a low magnetoresistive effect and a decreased reproducing activity.

Figure 13:
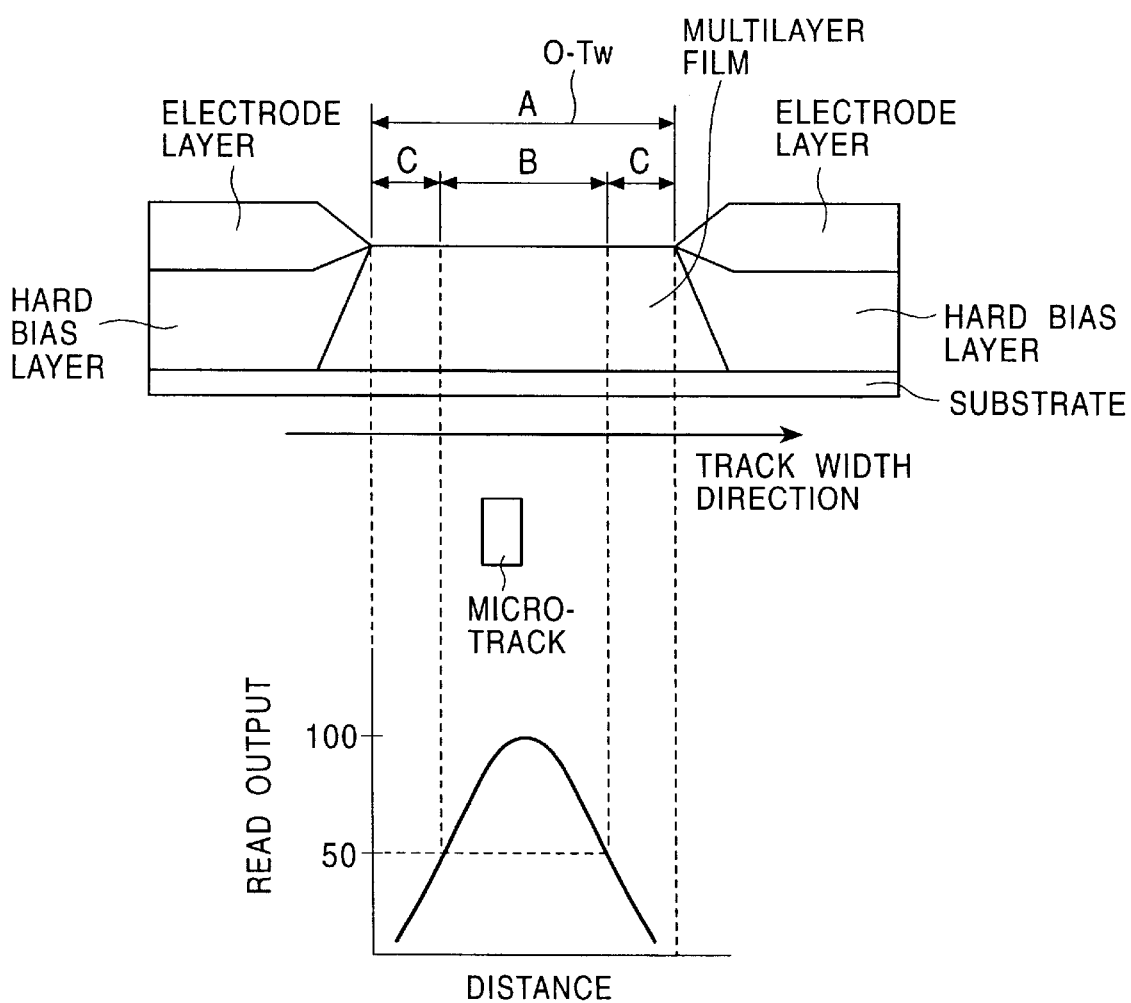
FIG. 13 is a diagram showing the determination procedure of a sensing region B and a dead zone C occupying a multilayer film of a magnetoresistive element.

In the present embodiment, the width T57 of the sensing region E and the width T58 of the dead zones D and D in the multilayer film 200 are determined by the above microtrack profiling technique (FIG. 13).

In the embodiment shown in FIG. 2, electrode layers 130 and 130 are formed on both sides of the multilayer film 200 on the hard bias layers 77 and 77 and extend, with a width T59, over the dead zones D and D of the multilayer film 200. The electrode layers 130 and 130 are each made of, for example, a film of Cr, Au, Ta, or W. The width of a top surface of the multilayer film 200 in a portion not covered by the electrode layers 130 and 130 is defined as an optical read track width O-Tw determined by an optical technique.

The width of a portion of the sensing region E not covered by the electrode layers 130 and 130 substantially acts as a track width and is defied as a magnetic read track width M-Tw.

In the embodiment shown in FIG. 2, the optical read track width O-Tw, the magnetic read track width M-Tw, and the width T57 of the sensing region E are all nearly identical in size.

However, the electrode layers 130 and 130 formed on the multilayer film 200 may not completely cover the dead zone D and may be shorter than the dead zone D. In this case, the optical read track width O-Tw is shorter than the magnetic read track width M-Tw.

By the above configuration, a sensing current from the electrode layers 130 and 130 becomes resistant to flow into the hard bias layers 77 and 77, to thereby increase the proportion of the sensing current flowing directly into the multilayer film 200 without the interposition of the hard bias layers 77 and 77. In addition, the electrode layers 130 and 130 are formed so as to extend even over the dead zones D and D to thereby increase junction areas between the multilayer film 200 and the hard bias layers 77 and 77 and the electrode layers 130 and 130. The direct current resistance (DCR) can therefore be reduced to thereby improve the reproducing characteristics.

When the electrode layers 130 and 130 are formed so as to extend even over the dead zones D and D, the production of noises due to the sensing current separated and flown into the dead zones D and D can be inhibited.

Particularly, when the optical read track width O-Tw and the width T57 (=the magnetic read track width M-Tw) of the sensing region E are formed so as to be identical, the sensing current can be appropriately allowed to flow in the sensing region E to thereby further improve the reproducing characteristics.

In the embodiment shown in FIG. 2, the angle $\theta 20$ formed between the front end face 130$a$ of the electrode layer 130 and the surface 15$a$ of the protective layer 15 may be preferably set at 60 degrees or more, and more preferably at 90 degrees or more, which front end face 130$a$ is in contact with the portions on both sides of the insulating layer 131, and which electrode layer 130 extends over the dead zone of the multilayer film 200. By this configuration, a sensing current can be allowed to flow always at a constant level even to the end of the electrode layer 130. Specifically, the production of noises due to the sensing current separated and flown into the dead zone can be inhibited.

Figure 14:
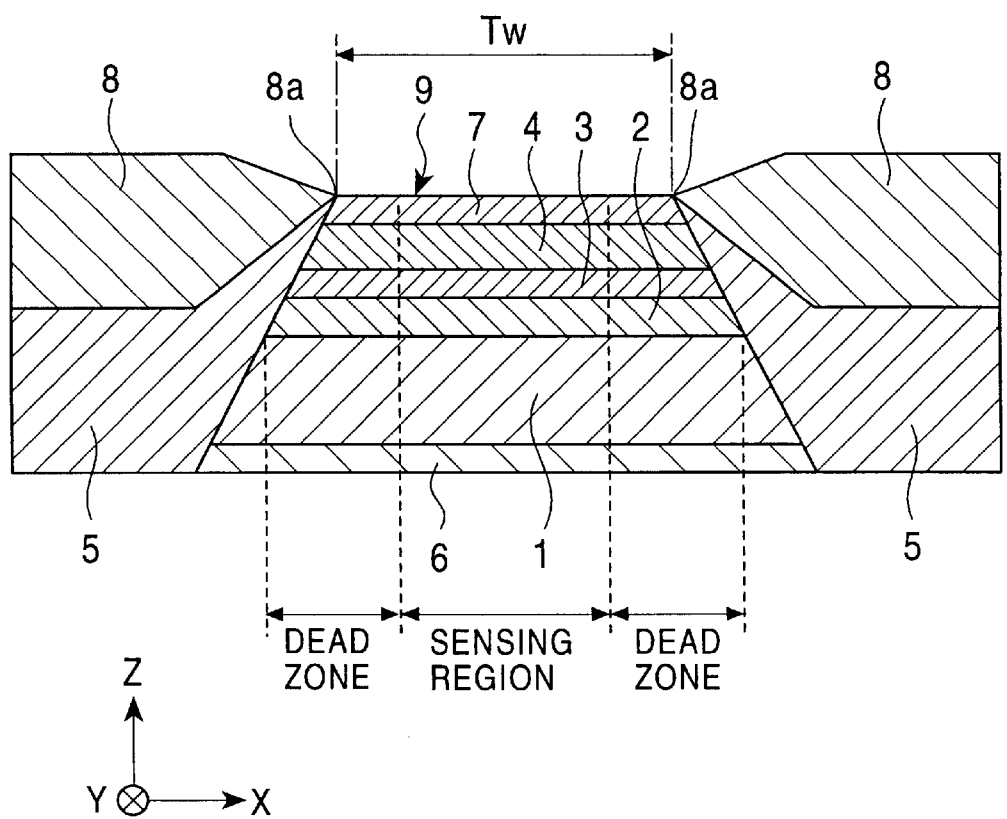
FIG. 14 is a local sectional view showing the structure of a conventional magnetoresistive element.

When an electrode layer having a tapered shape toward its front end face as in the conventional magnetoresistive element shown in FIG. 14 extends over a dead zone of a multilayer film, a portion of the electrode layer extending over the dead zone of the multilayer film cannot be significantly formed with a constant width, and the resulting magnetoresistive element can have the electrode region whose end extends over a sensing region.

If the front end face of the electrode layer extends over the sensing region, the region where the sensing current flows has a shorter width than that of the sensing region to thereby narrow a region where the magnetoresistive element can actually detect a magnetic field.

In contrast, by manufacturing the invented magnetoresistive element according to the process mentioned below, the location of the insulating layer 131 on the multilayer film 200 can be accurately set to thereby prevent the electrode layer 130 from extending beyond the dead zone.

Specifically, the width T59 of the electrode layer 130 extending over the multilayer film 200 is preferably more than 0 $\mu$m and equal to or less than 0.08 $\mu$m, and more preferably equal to or more than 0.05 $\mu$m and equal to or less than 0.08 $\mu$m.

If the width T59 of the electrode layer 130 is set more than 0.08 $\mu$m, noise signals are produced in read output, which has been verified by an experiment. The value 0.08 $\mu$m is the maximum width of a top surface of the dead zone D, and if the width T59 of the electrode layer 130 is set more than 0.08 $\mu$m, the electrode layer 130 is then partially formed over the sensing region E.

In addition, the result of a micro-magnetic simulation indicates that the electrode layer 130 having a width T59 of equal to or more than 0.05 $\mu$m can cover the region where the magnetization vector in the free magnetic layer F is disturbed to thereby improve the reproducing characteristics of the resulting magnetoresistive element.

However, the electrode layers 130 and 130 extending over the multilayer film 200 must not extend over the sensing region E. The formation of the electrode layers extending over the multilayer film is undesirable for the following reasons.

The sensing current mainly flows out of the ends of the electrode layers 130 and 130 extending over a top surface of the multilayer film 200, and if the electrode layers 130 and 130 cover even the sensing region E which substantially exhibits the magnetoresistive effect, the sensing current becomes resistant to flow in the portions of the sensing region E covered by the electrode layers 130 and 130. Thus, part of the sensing region E which can satisfactory exhibit the magnetoresistive effect is disabled to thereby decrease the read output. The portions of the sensing region E covered by the electrode layers 130 and 130 have a little sensitivity, and the magnetic resistance therefore varies at both ends of the magnetic read track width M-Tw to produce noises.

Figure 3:
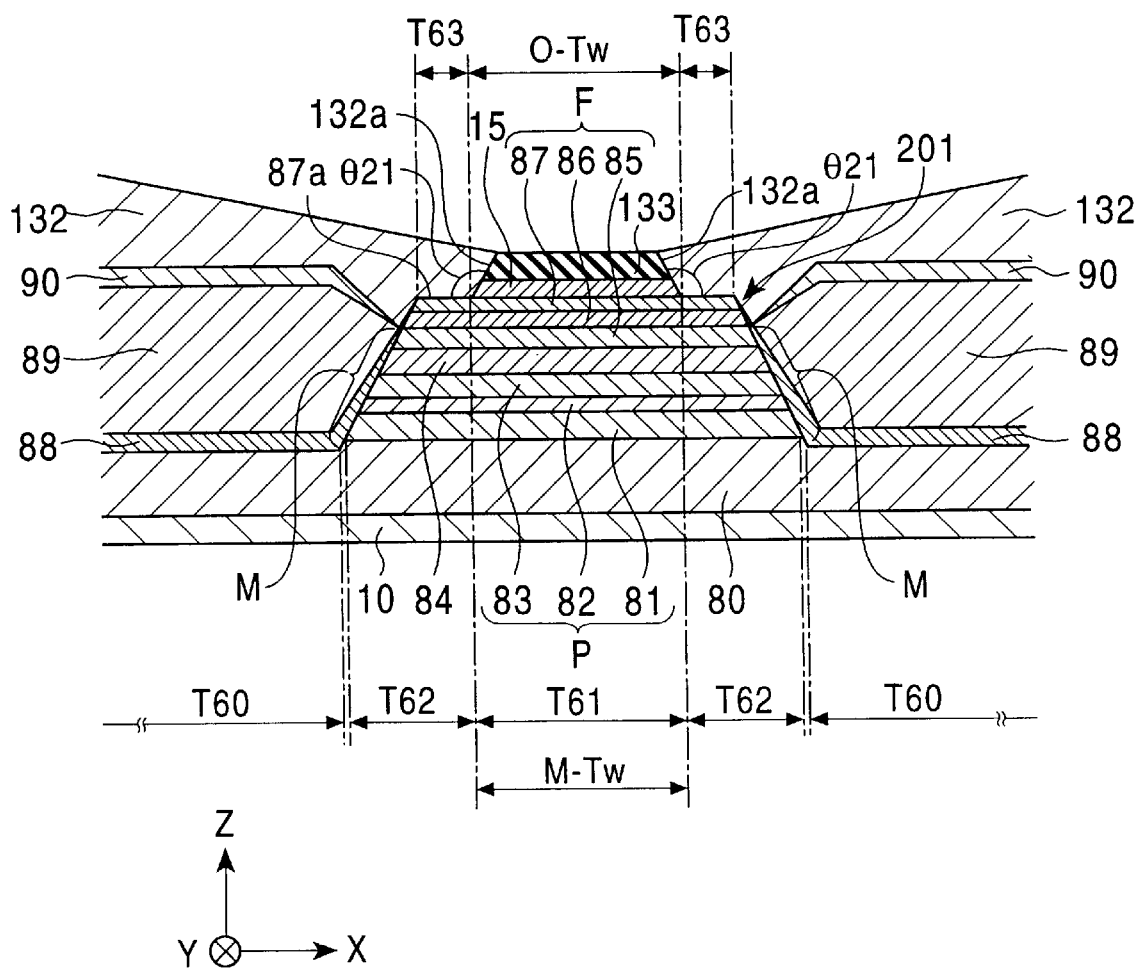
FIG. 3 is a local sectional view showing the structure of a magnetoresistive element as a third embodiment of the present invention.

FIG. 3 is a sectional view showing the structure a magnetoresistive element as a further embodiment of the invention, taken from ABS side.

A spin-valve thin film element shown in FIG. 3 includes an antiferromagnetic layer 80 formed on an underlayer 10. The antiferromagnetic layer 80 extends long in the X direction and protrudes at the center in the X direction. A first pinned magnetic layer 81, a nonmagnetic material layer 82, a second pinned magnetic layer 83, a nonmagnetic layer 84 composed of a conductive material, a first free magnetic layer 85, a nonmagnetic material layer 86, a second free magnetic layer 87, and a protective layer 15 are formed on the protruded portion of the antiferromagnetic layer 80. Thus, a laminate from the underlayer 10 to the protective layer 15 constitutes a multilayer film 201.

In the present embodiment, the antiferromagnetic layer 80 is made of a Pt—Mn (platinum-manganese) alloy film. Alternatively, the antiferromagnetic layer 80 may be made of an X—Mn alloy, wherein X is at least one element selected from Pd, Ir, Rh, and Ru, or a Pt—Mn—X' alloy, wherein X' is at least one element selected from Pd, Ir, Rh, Ru, Au, and Ag, instead of the Pt—Mn alloy.

The first pinned magnetic layer 81, the second pinned magnetic layer 83, the first free magnetic layer 85, and the second free magnetic layer 87 are each made of, for example, a Ni—Fe (nickel-iron) alloy, Co (cobalt), an Fe—Co (iron-cobalt) alloy, or an Fe—Co—Ni alloy.

The nonmagnetic layer 84 is made of Cu (copper) or another nonmagnetic conductive material having a low electric resistance.

As shown in FIG. 3, metal films 88 and 88 made of, for example, Cr and serving as buffer films and orienting films are formed on the portions of the antiferromagnetic layer 80 with a width T60 extending in the X direction and on both slanted side faces of the laminate structure including the first pinned magnetic layer 81, the nonmagnetic material layer 82, the second pinned magnetic layer 83, the nonmagnetic layer 84, and the first free magnetic layer 85. The formation of the metal films 88 and 88 can increase a bias magnetic field generated from hard bias layers 89 and 89 mentioned below.

The hard bias layers 89 and 89 made of, for example, a Co—Pt (cobalt-platinum) alloy or a Co—Cr—Pt (cobalt-chromium-platinum) alloy are formed on the metal films 88 and 88.

In addition, intermediate layers 90 and 90 each made of a nonmagnetic material such as Ta (tantalum) are formed on the hard bias layers 89 and 89, and electrode layers 132 and 132 made of, for example, Cr, Au, Ta, or W are formed on the intermediate layers 90 and 90.

The magnetoresistive element shown in FIG. 3 also includes an insulating layer 133 made of, for example, $Al_2O_3$ and laminated on the multilayer film 201, and front end faces 132a and 132a of electrode layers 132 and 132 are in contact with the both sides of the insulating layer 133.

According to the present embodiment, the front end faces 132a and 132a of the electrode layers 132 and 132 on the multilayer film 201 side are laminated so as to be along the sides of the insulating layer 133, and the thickness of the electrode layers 132 and 132 is kept thick even in regions where the electrode layers 132 and 132 are in contact with the multilayer film 201, owing to the thickness of the insulating layer 133. A sensing current can therefore be allowed to flow in the multilayer film 201 of the magnetoresistive element always at a constant level to thereby improve the reproducing characteristics.

By manufacturing the magnetoresistive element shown in FIG. 3 by the process mentioned below, the sides of the multilayer film 201 are put in parallel with the sides of the insulating layer 133 in the magnetoresistive element.

According to the embodiment shown in FIG. 3, the antiferromagnetic layer 80 extends even under the hard bias layers 89 and 89, and the hard bias layers 89 and 89 can have a reduced thickness. Accordingly, the hard bias layers 89 and 89 can be easily formed by, for example, sputtering.

In the embodiment shown in FIG. 3, a laminate including the first pinned magnetic layer 81 and the second pinned magnetic layer 83 having different magnetic moments from each other through the interposition of the nonmagnetic material layer 82 acts as one pinned magnetic layer P.

The first pinned magnetic layer 81 is formed in contact with the antiferromagnetic layer 80. When the antiferromagnetic layer 80 and the first pinned magnetic layer 81 are annealed in a given magnetic field, an exchange anisotropic magnetic field is generated through exchange coupling at the interface between the two layers to thereby fix the magnetization vector in the first pinned magnetic layer 81 in the Y direction. When the magnetization vector in the first pinned magnetic layer 81 is fixed in the Y direction, the magnetization vector in the second pinned magnetic layer 83 facing the first pinned magnetic layer 81 through the interposition of the nonmagnetic material layer 82 is fixed in parallel with and opposite to the magnetization vector in the first pinned magnetic layer 81.

The orientation of a synthetic magnetic moment as the sum of the magnetic moment of the first pinned magnetic layer 81 and the magnetic moment of the second pinned magnetic layer 83 is the magnetization vector in the pinned magnetic layer P.

The first pinned magnetic layer 81 and the second pinned magnetic layer 83 are in a ferrimagnetic state where the magnetization vectors in the two layers are in parallel with and opposite to each other. In this case, the first pinned magnetic layer 81 and the second pinned magnetic layer 83 respectively fix the magnetization vector in the other one, and the magnetization vector in the overall pinned magnetic layer P can be stabilized in a fixed direction.

In the embodiment shown in FIG. 3, the first pinned magnetic layer 81 and the second pinned magnetic layer 83 are made of the same material and have different thickness from each other to thereby have different magnetic moments.

The nonmagnetic material layer 82 lying between the first pinned magnetic layer 81 and the second pinned magnetic layer 83 is made of one metal or an alloy of two or more metals selected from Ru, Rh, Ir, Cr, Re, and Cu.

The first free magnetic layer 85 and the second free magnetic layer 87 are made so as to have different magnetic moments from each other. The first free magnetic layer 85 and the second free magnetic layer 87 are made of the same material and have different thickness from each other to thereby have different magnetic moments.

The nonmagnetic material layer 86 is made of one metal or an alloy of two or more metals selected from Ru, Rh, Ir, Cr, Re, and Cu.

In the embodiment shown in FIG. 3, a laminate including the first free magnetic layer 85 and the second free magnetic layer 87 through the interposition of the nonmagnetic material layer 86 acts as one free magnetic layer F.

As the first free magnetic layer 85 and the second free magnetic layer 87 are put into a ferrimagnetic state where the magnetization vectors in the two layers are in parallel with and opposite to each other, equivalent advantages to the case where the thickness of the free magnetic layer F is reduced can be obtained. Accordingly, the magnetization vector in the free magnetic layer F becomes apt to vary to thereby improve the magnetic field detecting sensitivity of the magnetoresistive element.

The orientation of a synthetic magnetic moment as the sum of the magnetic moment of the first free magnetic layer 85 and that of the second free magnetic layer 87 is the magnetization vector in the free magnetic layer F.

The magnetization vector in the free magnetic layer F is aligned in the X direction by the effect of a bias magnetic field in the X direction from the hard bias layers 89 and 89 which are magnetized in the X direction (track width direction).

However, the free magnetic layer F or the pinned magnetic layer P may have a single-layer structure composed of a soft magnetic thin film, as in the embodiment shown in FIG. 1.

With reference to FIG. 3, the region with a width T61 at the center of the multilayer film 201 is a sensing region E, and the regions with a width T62 on both sides of the sensing region are dead zones D and D.

In the sensing region E, the magnetization vector in the pinned magnetic layer P is properly fixed in the Y direction, and the magnetization vector in the free magnetic layer F is properly aligned in the X direction. Specifically, the magnetization vectors in the two layers are perpendicular to each other. The magnetization vector in the free magnetic layer F therefore sensitively varies with an external magnetic field from the recording medium.

In contrast, the portions around both sides of the free magnetic layer F have disturbed magnetization vectors and are dead zones D and D having a low reproducing sensitivity without substantially exhibiting the magnetoresistive effect.

The sensing region E and the dead zones D and D in the multilayer film 201 in the present embodiment are also determined by the above microtrack profiling technique.

The electrode layers 132 and 132 formed on both sides of the multilayer film 201 extend over the multilayer film 201. The width of a top surface of the multilayer film 201 in a portion not covered by the electrode layers 132 and 132 is defined as an optical read track width O-Tw.

The width of the sensing region E of a portion not covered by the electrode layers 132 and 132 is defined as a magnetic read track width M-Tw. The magnetic read track width M-Tw has a width T61 which is the same with the width of the sensing region E.

In the present embodiment, the electrode layers 132 and 132 formed on the multilayer film 201 completely cover the dead zones D and D, and the optical read track width O-Tw and the magnetic read track width M-Tw (=the width of the sensing region E) are nearly identical in size.

However, the electrode layers 132 and 132 formed on the multilayer film 201 may not completely cover the dead zones D and D and may be shorter than the dead zones D and D. In this case, the optical read track width O-Tw is formed greater than the magnetic read track width M-Tw.

The above configuration can increase the proportion of a sensing current from the electrode layers 132 and 132 which flows directly into the multilayer film 201 without the interposition of the hard bias layers 89 and 89.

When the electrode layers 132 and 132 are formed so as to extend even over the dead zones D and D, the production of noises due to the sensing current separated and flown into the dead zones can be inhibited.

In the embodiment shown in FIG. 3, the angle θ21 formed between the front end face 132a of the electrode layer 132 and the surface 87a of the second free magnetic layer 87 may be preferably set at 60 degrees or more, and more preferably at 90 degrees or more, which front end face 132a is in contact with the portions at both sides of the insulating layer 133, and which electrode layer 132 extends over the dead zone of the multilayer film 201. By this configuration, a sensing current can be allowed to flow always at a constant level even to the end of the electrode layer 132. Specifically, the production of noises due to the sensing current separated and flown into the dead zone can be inhibited.

By manufacturing the magnetoresistive element of the present embodiment by the process mentioned below, the location of the insulating layer 133 on the multilayer film 201 can be accurately set to thereby prevent the electrode layer 132 from extending beyond the dead zone.

Specifically, the width T63 of the electrode layers 132 and 132 extending over the dead zones D and D of the multilayer film 201 as shown in FIG. 3 is preferably more than 0 μm and equal to or less than 0.08 μm, and more preferably equal to or more than 0.05 μm and equal to or less than 0.08 μm.

In the embodiment shown in FIG. 3, magnetic interfaces M and M between the multilayer film 201 and the hard bias layers 89 and 89 overlap only the side of the first free magnetic layer 85, of the sides of the first magnetic layer 85 and the second free magnetic layer 87.

The hard bias layers 89 and 89 have only to align the magnetization vector in either one of the first free magnetic layer 85 and the second free magnetic layer 87. When the magnetization vector in either one free magnetic layer is aligned or oriented in a fixed direction, the other adjacent free magnetic layer is put into a ferrimagnetic state where the magnetization vector in this layer is in parallel with and opposite to the magnetization vector of the former layer. Thus, the orientation of the synthetic magnetic moment as the sum of the first and second free magnetic layers is put into a fixed direction, e.g., the track width direction in the embodiment shown in FIG. 3.

If the hard bias layers 89 and 89 are magnetically connected with both the first free magnetic layer 85 and the second free magnetic layer 87, the magnetization vectors in the portions on both sides of the first free magnetic layer 85 and the second free magnetic layer 87 become greatly disturbed. In contrast, the configuration shown in FIG. 3 can prevent the magnetization vectors in the portions on both sides of the both free magnetic layers from disordering to thereby increase the width T61 of the sensing region E.

The protective layer 15 is formed on the multilayer film 201 in a portion not in contact with the electrode layers 132 and 132, and the electrode layers 132 and 132 are directly joined with the second free magnetic layer 87 without the interposition of the protective layer 15.

The resulting magnetoresistive element can therefore have a lower electric resistance and improved characteristics than those in case where the electrode layers 132 and 132 are laminated on the protective layer 15.

Figure 4:
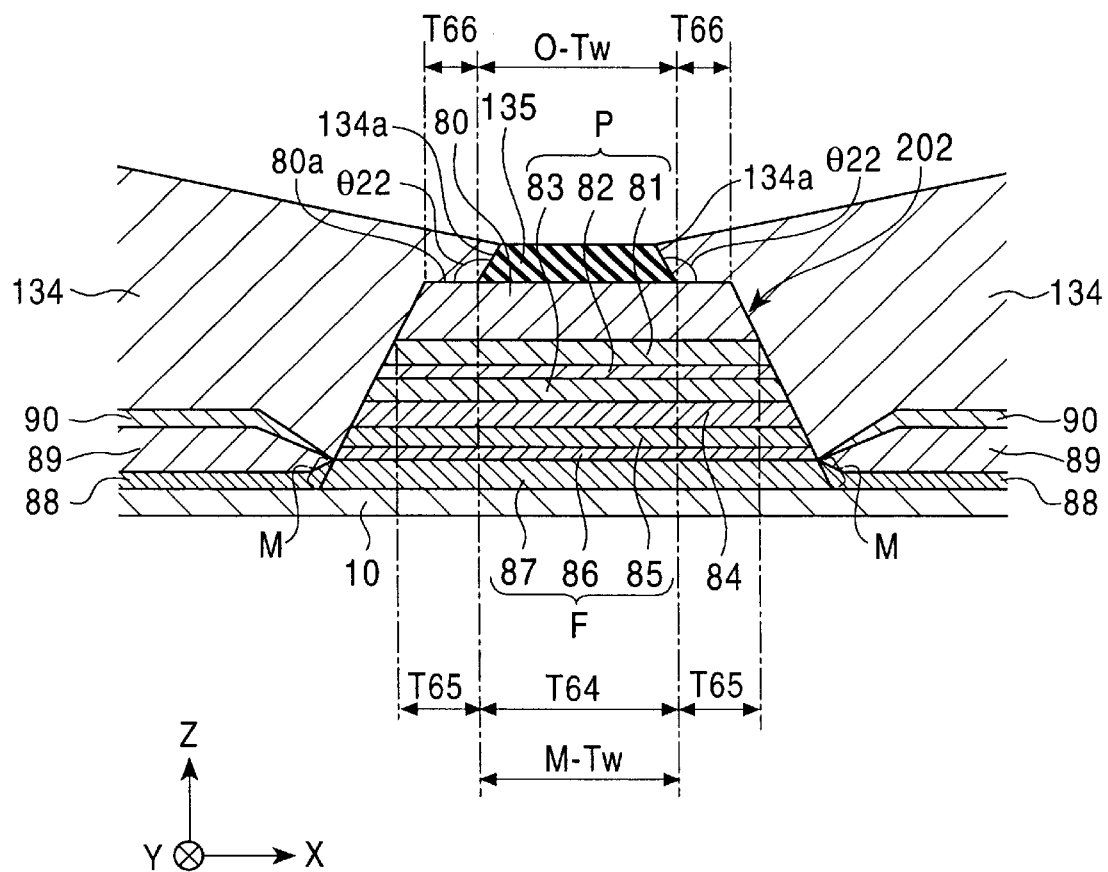
FIG. 4 is a local sectional view showing the structure of a magnetoresistive element as a fourth embodiment of the present invention.

A multilayer film 202 of a spin-valve thin film element shown in FIG. 4 has a laminate structure in reverse order to that of the multilayer film 201 of the spin-valve thin film element shown in FIG. 3. Specifically, the magnetoresistive element shown in FIG. 4 includes a laminate including the underlayer 10, the second free magnetic layer 87, the nonmagnetic material layer 86, the first free magnetic layer 85, the nonmagnetic layer 84, the second pinned magnetic layer 83, the nonmagnetic material layer 82, the first pinned magnetic layer 81, the antiferromagnetic layer 80, and the protective layer 15 continuously laminated in this order.

The magnetoresistive element shown in FIG. 4 also includes an insulating layer 135 made of, for example, $Al_2O_3$ and laminated on the multilayer film 202, and front end faces 134a and 134a of electrode layers 134 and 134 are in contact with the both sides of the insulating layer 135.

According to the present embodiment, the front end faces 134a and 134a of the electrode layers 134 and 134 on the multilayer film 202 side are laminated so as to be along the sides of the insulating layer 135, and the thickness of the electrode layers 134 and 134 is kept thick even in regions where the electrode layers 134 and 134 are in contact with the multilayer film 202, owing to the thickness of the insulating layer 135. A sensing current can therefore be allowed to flow in the multilayer film 202 of the magnetoresistive element always at a constant level to thereby improve the reproducing characteristics.

By manufacturing the magnetoresistive element shown in FIG. 4 by the process mentioned below, the sides of the multilayer film 202 are put in parallel with the sides of the insulating layer 135 in the magnetoresistive element.

In the embodiment shown in FIG. 4, the hard bias layers 89 and 89 are not magnetically connected with the sides of the first pinned magnetic layer 81 and the second pinned magnetic layer 83 where the magnetization vectors in the two layers are aligned in parallel in the Y direction. This configuration can prevent the magnetization vectors of the first pinned magnetic layer 81 and the second pinned magnetic layer 83 from varying with a magnetic field applied from the hard bias layers 89 and 89, to thereby improve the characteristics of the magnetoresistive element.

A laminate including the first pinned magnetic layer 81 and the second pinned magnetic layer 83 having different magnetic moments from each other through the interposition of the nonmagnetic material layer 82 acts as one pinned magnetic layer P in the embodiment shown in FIG. 4. In the present embodiment, the first pinned magnetic layer 81 and the second pinned magnetic layer 83 are made of the same material and have different thickness from each other to thereby have different magnetic moments.

The first pinned magnetic layer 81 is formed in contact with the antiferromagnetic layer 80 also in the magnetoresistive element shown in FIG. 4. When the antiferromagnetic layer 80 and the first pinned magnetic layer 81 are annealed in a given magnetic field, an exchange anisotropic magnetic field is generated through exchange coupling at the interface between the two layers to thereby fix the magnetization vector in the first pinned magnetic layer 81 in the Y direction. When the magnetization vector in the first pinned magnetic layer 81 is fixed in the Y direction, the magnetization vector in the second pinned magnetic layer 83 facing the first pinned magnetic layer 81 through the interposition of the nonmagnetic material layer 82 is fixed in parallel with and opposite to the magnetization vector in the first pinned magnetic layer 81. The orientation of a synthetic magnetic moment as the sum of the magnetic moment of the first pinned magnetic layer 81 and the magnetic moment of the second pinned magnetic layer 83 is the magnetization vector in the pinned magnetic layer P.

A laminate including the first free magnetic layer 85 and the second free magnetic layer 87 through the interposition of the nonmagnetic material layer 86 acts as one free magnetic layer F.

The first free magnetic layer 85 and the second free magnetic layer 87 in this embodiment are also made of the same material and have different thickness from each other to thereby have different magnetic moments.

In the spin-valve thin film element shown in FIG. 4, the first free magnetic layer 85 and the second free magnetic layer 87 are put into a ferrimagnetic state where the magnetization vectors in the two layers are in parallel with and opposite to each other, and equivalent advantages to the case where the thickness of the free magnetic layer F is reduced can be obtained. Accordingly, the magnetization vector in the free magnetic layer F becomes apt to vary to thereby improve the magnetic field detecting sensitivity of the magnetoresistive element.

The orientation of a synthetic magnetic moment as the sum of the magnetic moment of the first free magnetic layer 85 and that of the second free magnetic layer 87 is the magnetization vector in the free magnetic layer F.

The magnetization vector in the free magnetic layer F is aligned in the X direction by the effect of a bias magnetic field in the X direction from the hard bias layers 89 and 89 which are magnetized in the X direction (track width direction).

However, the free magnetic layer F or the pinned magnetic layer P may have a single-layer structure composed of a soft magnetic thin film, as in the embodiment shown in FIG. 1.

With reference to FIG. 4, a region with a width T64 at the center of the multilayer film 202 is a sensing region E, and regions with a width T65 on both sides of the sensing region are dead zones D and D.

In the sensing region E, the magnetization vector in the pinned magnetic layer P is properly fixed in the Y direction, and the magnetization vector in the free magnetic layer F is properly aligned in the X direction. Specifically, the magnetization vectors in the two layers are perpendicular to each other. The magnetization vector in the free magnetic layer F therefore sensitively varies with an external magnetic field from the recording medium.

In contrast, the portions around both sides of the free magnetic layer F have disturbed magnetization vectors and are the dead zones D and D having a low reproducing sensitivity without substantially exhibiting the magnetoresistive effect.

Also in the present embodiment, the sensing region E and the dead zones D and D in the multilayer film 202 are determined by the above microtrack profiling technique.

The electrode layers 134 and 134 formed on both sides of the multilayer film 202 extend over the multilayer film 202. The width of a top surface of the multilayer film 201 in a portion not covered by the electrode layers 134 and 134 is defined as an optical read track width O-Tw.

The width of the sensing region E of a portion not covered by the electrode layers 134 and 134 is defined as a magnetic read track width M-Tw, which is identical in size with the width T64 of the sensing region E.

In the embodiment shown in FIG. 4, the electrode layers 134 and 134 formed on the multilayer film 202 completely cover the dead zones D and D, and the optical read track width O-Tw and the magnetic read track width M-Tw (=the width of the sensing region E) are nearly identical in size.

However, the electrode layers 134 and 134 formed on the multilayer film 202 may not completely cover the dead zones D and D and may be shorter than the dead zones D and D. In this case, the optical read track width O-Tw is formed greater than the magnetic read track width M-Tw.

The above configuration can increase the proportion of a sensing current from the electrode layers 134 and 134 which flows directly into the multilayer film 202 without the interposition of the hard bias layers 89 and 89.

When the electrode layers 134 and 134 are formed so as to extend even over the dead zones D and D, the production of noises due to the sensing current separated and flown into the dead zones can be inhibited.

In the embodiment shown in FIG. 4, the angle θ22 formed between the front end face 134a of the electrode layer 134 and the surface 80a of the antiferromagnetic layer 80 may be preferably set at 60 degrees or more, and more preferably at 90 degrees or more, which front end face 134a is in contact with the both sides of the insulating layer 135, and which electrode layer 134 extends over the dead zone of the multilayer film 202. By this configuration, a sensing current can be allowed to flow even to the end of the electrode layer 134 always at a constant level. Specifically, the production of noises due to the sensing current separated and flown into the dead zone can be inhibited.

By manufacturing the magnetoresistive element of the present embodiment by the process mentioned below, the location of the insulating layer 135 on the multilayer film 202 can be accurately set to thereby prevent the electrode layer 134 from extending beyond the dead zone.

Specifically, the width T66 of the electrode layers 134 and 134 extending over the dead zones D and D of the multilayer film 202 is preferably more than 0 µm and equal to or less than 0.08 µm, and more preferably equal to or more than 0.05 µm and equal to or less than 0.08 µm.

Magnetic interfaces M and M between the multilayer film 202 and the hard bias layers 89 and 89 in the embodiment shown in FIG. 4 overlap only the sides of the second free magnetic layer 87, of the sides of the first and second free magnetic layers 85 and 87. This configuration can prevent the magnetization vectors of the portions on both sides of the two free magnetic layers from disordering to thereby increase the width T64 of the sensing region E.

Particularly, the hard bias layers 89 and 89 in the embodiment shown in FIG. 4 are not electrically connected with the pinned magnetic layer P, and a magnetic field generated from the hard bias layers 89 and 89 is therefore prevented from affecting the magnetization vector in the pinned magnetic layer P.

In the embodiment shown in FIG. 4, the protective layer is not formed on a top surface of the multilayer film 202, and the insulating layer 135 is formed directly on the antiferromagnetic layer 80 and serves also as an antioxidant protective layer. In addition, the electrode layers 134 and 134 are directly joined with the antiferromagnetic layer 80.

The resulting magnetoresistive element can therefore have a lower electric resistance and improved characteristics than those in case where the electrode layers 134 and 134 are laminated on the protective layer.

Figure 5:
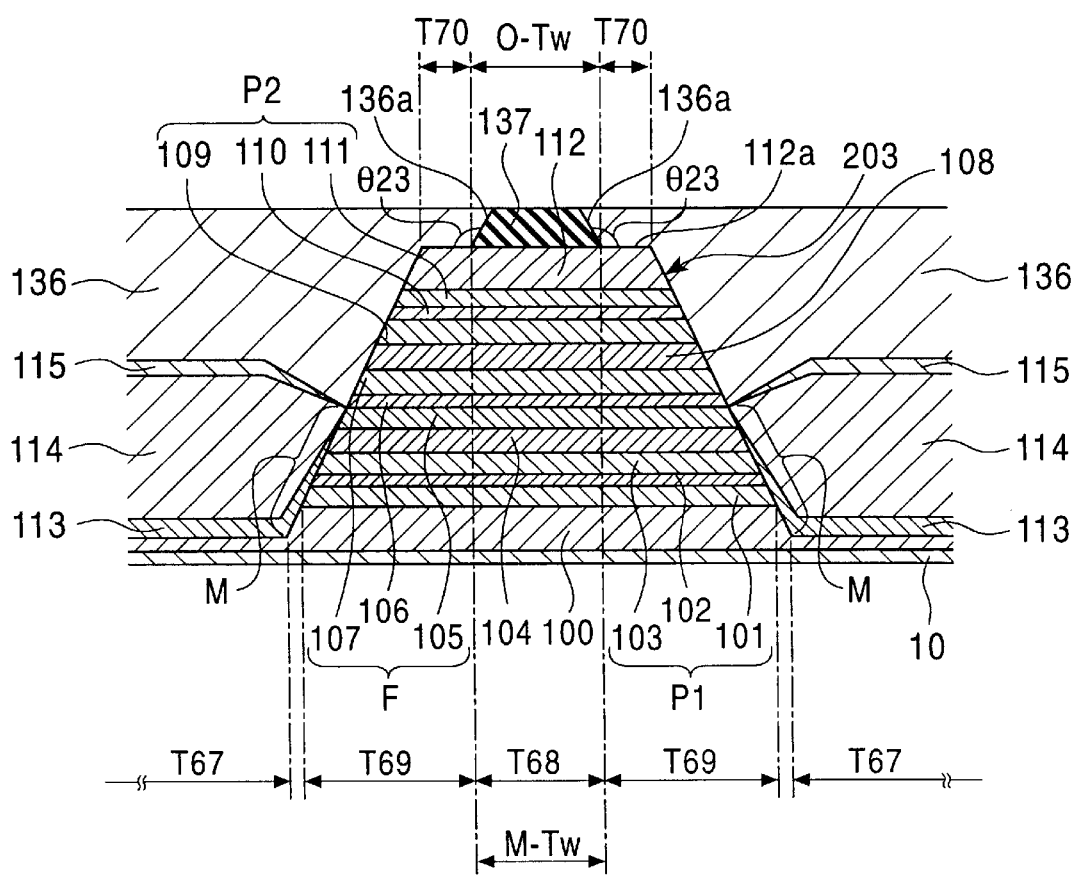
FIG. 5 is a local sectional view showing the structure of a magnetoresistive element as a fifth embodiment of the present invention.

FIG. 5 is a sectional view showing the structure of a magnetoresistive element as yet another embodiment of the present invention, taken from ABS side.

This spin-valve thin film element is a so-called dual spin-valve thin film element. This element includes, a nonmagnetic material layer 106 as a center, and a first free magnetic layer 105, a second free magnetic layer 107, nonmagnetic layers 104 and 108 made of conductive materials, a first pinned magnetic layer 103, a third pinned magnetic layer 109, nonmagnetic material layers 102 and 110, a second pinned magnetic layer 101, a fourth pinned magnetic layer 111, and antiferromagnetic layers 100 and 112 formed on and under the nonmagnetic material layer 106 in this order. This type of dual spin-valve thin film element can yield a higher read output than the spin-valve thin film elements (single spin-valve thin film elements) as shown in FIGS. 2 to 5. In this element, a lowermost layer is an underlayer 10, and a laminate from the underlayer 10 to the antiferromagnetic layer 112 constitutes a multilayer film 203.

In the embodiment shown in FIG. 5, the antiferromagnetic layer 100 on the underlayer 10 is formed long in the X direction and protrudes at the center in the X direction.

In the present embodiment, the antiferromagnetic layers 100 and 112 are each made of a Pt—Mn (platinum-manganese) alloy film. Alternatively, these layers may be made of an X—Mn alloy, wherein X is at least one element selected from Pd, Ir, Rh, and Ru, or a Pt—Mn—X' alloy, wherein X' is at least one element selected from Pd, Ir, Rh, Ru, Au, and Ag, instead of the Pt—Mn alloy.

The first free magnetic layer 105, the second free magnetic layer 107, the first pinned magnetic layer 103, the second pinned magnetic layer 101, the third pinned magnetic layer 109, and the fourth pinned magnetic layer 111 are each made of, for example, a Ni—Fe (nickel-iron) alloy, Co (cobalt), an Fe—Co (iron-cobalt) alloy, or an Fe—Co—Ni alloy. The nonmagnetic layers 104 and 108 are each made of Cu (copper) or another nonmagnetic conductive material having a low electric resistance.

As shown in FIG. 5, metal films 113 and 113 made of, for example, Cr and serving as buffer films and orienting films are formed on the portions with a width T67 of the antiferromagnetic layer 100 extending in the X direction and on both slanted side faces of the laminate structure including the second pinned magnetic layer 101, the nonmagnetic material layer 102, the first pinned magnetic layer 103, the nonmagnetic layer 104, and the first free magnetic layer 105. The formation of the metal films 113 and 113 can increase a bias magnetic field generated from hard bias layers 114 and 114 mentioned below.

The hard bias layers 114 and 114 are each made of, for example, a Co—Pt (cobalt-platinum) alloy or a Co—Cr—Pt (cobalt-chromium-platinum) alloy and are formed on the metal films 113 and 113.

In addition, intermediate layers 115 and 115 made of a nonmagnetic material such as Ta (tantalum) are formed on the hard bias layers 114 and 114, and electrode layers 136 and 136 made of, for example, Cr, Au, Ta, or W are formed on the intermediate layers 115 and 115.

The magnetoresistive element shown in FIG. 5 also includes an insulating layer 137 made of, for example, $Al_2O_3$ and laminated on the multilayer film 203, and front end faces 136a and 136a of the electrode layers 136 and 136 are in contact with the both sides of the insulating layer 137.

According to the present embodiment, the front end faces 136a and 136a of the electrode layers 136 and 136 on the multilayer film 203 side are laminated so as to be along the sides of the insulating layer 137, and the thickness of the electrode layers 136 and 136 is kept thick even in regions where the electrode layers 136 and 136 are in contact with the multilayer film 203, owing to the thickness of the insulating layer 137. A sensing current can therefore be allowed to flow in the multilayer film 203 of the magnetoresistive element always at a constant level to thereby improve the reproducing characteristics.

By manufacturing the magnetoresistive element shown in FIG. 5 by the process mentioned below, the sides of the multilayer film 203 are put in parallel with the sides of the insulating layer 137.

According to the embodiment shown in FIG. 5, the antiferromagnetic layer 100 extends even under the hard bias layers 114 and 114, and the hard bias layers 114 and 114 can have a reduced thickness. Accordingly, the hard bias layers 114 and 114 can be easily formed by, for example, sputtering.

In the embodiment shown in FIG. 5, a laminate including the first pinned magnetic layer 103 and the second pinned magnetic layer 101 having different magnetic moments from each other through the interposition of the nonmagnetic material layer 102 acts as one pinned magnetic layer $P_1$. In addition, a laminate including the third pinned magnetic layer 109 and the fourth pinned magnetic layer 111 having different magnetic moments from each other through the interposition of the nonmagnetic material layer 110 acts as one pinned magnetic layer $P_2$.

The first pinned magnetic layer 103 and the second pinned magnetic layer 101 are in a ferrimagnetic state where the magnetization vectors in the two layers are in parallel with and opposite to each other. The first pinned magnetic layer 103 and the second pinned magnetic layer 101 respectively fix the magnetization vector in the other one, and the magnetization vector in the overall pinned magnetic layer $P_1$ can be stabilized in a fixed direction.

In the embodiment shown in FIG. 5, the first pinned magnetic layer 103 and the second pinned magnetic layer 101 are made of the same material and have different thickness from each other to thereby have different magnetic moments.

In addition, the third pinned magnetic layer 109 and the fourth pinned magnetic layer 111 are in a ferrimagnetic state where the magnetization vectors in the two layers are in parallel with and opposite to each other. Hence, the third pinned magnetic layer 109 and the fourth pinned magnetic layer 111 respectively fix the magnetization vector in the other one layer.

The nonmagnetic material layers 102 and 110 are each made of one metal or an alloy of two or more metals selected from Ru, Rh, Ir, Cr, Re, and Cu.

The second pinned magnetic layer 101 and the fourth pinned magnetic layer 111 are formed in contact with the antiferromagnetic layers 100 and 112, respectively. When these layers are annealed in a given magnetic field, an exchange anisotropic magnetic field is generated through exchange coupling at the interface between the second pinned magnetic layer 101 and the antiferromagnetic layer 100, and at the interface between the fourth pinned magnetic layer 111 and the antiferromagnetic layer 112.

Hence, the magnetization vector in the second pinned magnetic layer 101 is fixed in the Y direction. Once the magnetization vector in the second pinned magnetic layer 101 is fixed in the Y direction, the magnetization vector in the first pinned magnetic layer 103 facing the second pinned magnetic layer 101 through the interposition of the nonmagnetic material layer 102 is fixed in parallel with and opposite to the magnetization vector of the second pinned magnetic layer 101. The orientation of a synthetic magnetic moment as the sum of the magnetic moment of the second pinned magnetic layer 101 and that of the first pinned magnetic layer 103 is the magnetization vector in the pinned magnetic layer $P_1$.

When the magnetization vector in the second pinned magnetic layer 101 is fixed in the Y direction, the magnetization vector in the fourth pinned magnetic layer 111 is preferably fixed in a direction in parallel with and opposite to the Y direction. In this case, the magnetization vector in the third pinned magnetic layer 109 facing the fourth pinned magnetic layer 111 through the interposition of the nonmagnetic material layer 110 is fixed in a direction in parallel with and opposite to the magnetization vector of the fourth pinned magnetic layer 111, that is, is fixed in the Y direction. The orientation of a synthetic magnetic moment as the sum of the magnetic moment of the fourth pinned magnetic layer 111 and that of the third pinned magnetic layer 109 is the magnetization vector in the pinned magnetic layer $P_2$.

Hence, the magnetization vectors in the first pinned magnetic layer 103 and the third pinned magnetic layer 109 are put in parallel with and opposite to each other, while the two layers face each other through the interposition of the first free magnetic layer 105, the nonmagnetic material layer 106, and the second free magnetic layer 107.

In the embodiment shown in FIG. 5, a free magnetic layer F is formed as a laminate including the first free magnetic layer 105 and the second free magnetic layer 107 through the interposition of the nonmagnetic material layer 106, as described below. The first free magnetic layer 105 and the second free magnetic layer 107 are put in a ferrimagnetic state where the magnetization vectors in the two layers are in parallel with and opposite to each other.

The first free magnetic layer 105 and the second free magnetic layer 107 change their magnetization vectors by the effect of an external magnetic field, while maintaining the ferrimagnetic state. When the magnetization vectors in the first pinned magnetic layer 103 and the third pinned magnetic layer 109 are in parallel with and opposite to each other, the rate of change in resistance of the portion upper than the free magnetic layer F and that of the portion lower than the free magnetic layer F become equal.

In addition, the magnetization vector in the pinned magnetic layer $P_1$ is preferably in parallel with and opposite to the magnetization vector in the pinned magnetic layer $P_2$.

For example, the magnitude of the magnetic moment of the second pinned magnetic layer 101, whose magnetization vector is fixed in the Y direction, is set greater than the magnitude of the magnetic moment of the first pinned magnetic layer 103, and the magnetization vector in the pinned magnetic layer $P_1$ is fixed in the Y direction. Separately, the magnitude of the magnetic moment of the third pinned magnetic layer 109 in which the magnetization vector is fixed in the Y direction, is set smaller than the magnitude of the magnetic moment of the fourth pinned magnetic layer 111, and the magnetization vector in the pinned magnetic layer $P_2$ is fixed in parallel with and opposite to the Y direction.

Hence, the orientation of a sensing current magnetic field generated when a sensing current is allowed to flow in the X direction is in agreement with the magnetization vectors of the pinned magnetic layer $P_1$ and of the pinned magnetic layer $P_2$, and the ferrimagnetic state between the first pinned magnetic layer 103 and the second pinned magnetic layer 101, and the ferrimagnetic state between the third pinned magnetic layer 109 and the fourth pinned magnetic layer 111 are stabilized.

The first free magnetic layer 105 and the second free magnetic layer 107 are formed so as to have different magnetic moments from each other. Also in this embodiment, the first free magnetic layer 105 and the second free magnetic layer 107 are made of the same material and have different thickness to thereby allow the two layers to have different magnetic moments.

The nonmagnetic material layers 102, 106, and 110 are each made of one metal or an alloy of two or more metals selected from Ru, Rh, Ir, Cr, Re, and Cu.

In the embodiment shown in FIG. 5, a laminate of the first free magnetic layer 105 and the second free magnetic layer 107 through the interposition of the nonmagnetic material layer 106 acts as one free magnetic layer F.

The first free magnetic layer 105 and the second free magnetic layer 107 are in a ferrimagnetic state where the magnetization vectors in the two layers are in parallel with and opposite to each other, and equivalent advantages to the case where the thickness of the free magnetic layer F is reduced can be obtained. Accordingly, the magnetization vector in the free magnetic layer F becomes apt to vary to thereby improve the magnetic field detecting sensitivity of the magnetoresistive element.

The orientation of a synthetic magnetic moment as the sum of the magnetic moment of the first free magnetic layer 105 and that of the second free magnetic layer 107 is the magnetization vector in the free magnetic layer F.

The magnetization vector in the free magnetic layer F is aligned in the X direction by the effect of a bias magnetic field in the X direction from the hard bias layers 114 and 114 which are magnetized in the X direction (track width direction).

However, the free magnetic layer F or the pinned magnetic layers $P_1$ and $P_2$ may have a single-layer structure composed of a soft magnetic thin film, as in the embodiment shown in FIG. 1.

The portions around both sides of the free magnetic layer F have disturbed magnetization vectors and are dead zones D and D having a low reproducing sensitivity without substantially exhibiting the magnetoresistive effect.

The sensing region E and the dead zones D and D in the multilayer film 203 in the present embodiment are also determined by the microtrack profiling technique. A region with a width T68 at the center of the multilayer film 203 is the sensing region E, and regions with a width T69 on both sides of the sensing region E are the dead zones D and D.

In the sensing region E, the magnetization vectors in the pinned magnetic layers $P_1$ and $P_2$ are properly fixed in a direction in parallel with the Y direction, and the magnetization vector in the free magnetic layer F is properly aligned in the X direction. Specifically, the magnetization vector in the free magnetic layer F is perpendicular to the magnetization vectors of the pinned magnetic layers $P_1$ and $P_2$. The magnetization vector in the free magnetic layer F therefore sensitively varies with an external magnetic field from the recording medium. The electrical resistance depends on the variation in the magnetization vector in the free magnetic layer F and the magnetization vectors in the pinned magnetic layers $P_1$ and $P_2$, hence the leakage magnetic field from the recording medium is detected by the variation in the voltage due to the variation in the electrical resistance.

According to the embodiment shown in FIG. 5, intermediate layers 115 and 115 made of a nonmagnetic material are formed on both sides of the multilayer film 203 on the hard bias layers 114 and 114. In addition, electrode layers 136 and 136 are formed on the intermediate layers 115 and 115 and extend over the dead zones D and D of the multilayer film 203. The electrode layers 136 and 136 are each made of, for example, a film of Cr, Au, Ta, or W.

The width of a top surface of the multilayer film 203 in a portion not covered by the electrode layers 136 and 136 is defined as an optical read track width O-Tw. The width T68 of the sensing region in a portion not covered by the electrode layers 136 and 136 is defined as a magnetic read track width M-Tw. In the present embodiment, the electrode layers 136 and 136 extending over the multilayer film 203 completely cover the portions over the dead zones D and D. In this case, the optical read track width O-Tw is nearly identical in size to the magnetic read track width M-Tw (=the width of the sensing region E).

Alternatively, the electrode layers 136 and 136 may not completely cover the portions over the dead zones D and D, and the width T70 of the electrode layers 136 and 136 extending over the multilayer film 203 may be shorter than the dead zones D and D. In this case, the optical read track width O-Tw is greater than the magnetic read track width M-Tw.

By the above configuration, a sensing current from the electrode layers 136 and 136 is facilitated to flow directly into the multilayer film 203 without the interposition of the hard bias layers 114 and 114. In addition, the electrode layers 136 and 136 are formed so as to extent even over the dead zones D and D to thereby increase junction areas between the multilayer film 203 and the electrode layers 136 and 136. The direct current resistance (DCR) can therefore be reduced to thereby improve the reproducing characteristics.

When the electrode layers 136 and 136 extend even over the dead zones D and D, the production of noises due to the sensing current separated and flown into the dead zones D and D can be inhibited.

In the embodiment shown in FIG. 5, the angle θ23 formed between the front end face 136a of the electrode layer 136 and the surface 112a of the antiferromagnetic layer 112 may be preferably set at 60 degrees or more, and more preferably at 90 degrees or more, which front end face 136a is in contact with the both sides of the insulating layer 137, and which electrode layer 136 extends over the dead zone of the multilayer film 203. By this configuration, a sensing current can be allowed to flow even to the end of the electrode layer 136 always at a constant level. Specifically, the production of noises due to the sensing current separated and flown into the dead zones D and D can be inhibited.

By manufacturing the invented magnetoresistive element of this embodiment by the process mentioned below, the location of the insulating layer 137 on the multilayer film 203 can be accurately set to thereby prevent the electrode layer 136 from extending beyond the dead zone.

Specifically, the width T70 of the electrode layers 136 and 136 extending over the dead zones of the multilayer film 203 as shown in FIG. 5 is preferably more than 0 µm and equal to or less than 0.08 µm, and more preferably equal to or more than 0.05 µm and equal to or less than 0.08 µm.

Magnetic interfaces M and M between the multilayer film 203 and the hard bias layers 114 and 114 in the embodiment shown in FIG. 5 overlap only the sides of the first free magnetic layer 105, of the sides of the first and second free magnetic layers 105 and 107. This configuration can prevent the magnetization vectors in the portions on both sides of the two free magnetic layers from disordering to thereby increase the width T68 of the sensing region E.

In the embodiment shown in FIG. 5, the protective layer is not formed on a top surface of the multilayer film 203, and the insulating layer 137 is formed directly on the antiferromagnetic layer 112 and serves also as an antioxidant protective layer. In addition, the electrode layers 136 and 136 are directly joined with the antiferromagnetic layer 112.

The resulting magnetoresistive element can therefore have a lower electric resistance and improved characteristics than those in case where the electrode layers 136 and 136 are laminated onto the protective layer.

Figure 6:
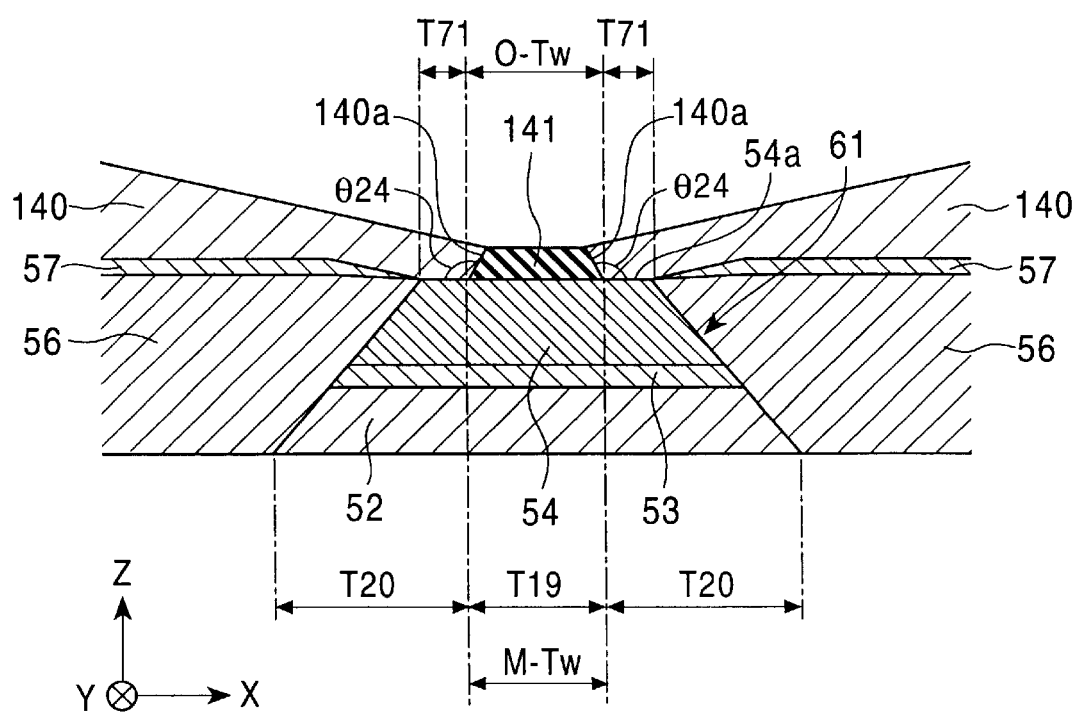
FIG. 6 is a local sectional view showing the structure of a magnetoresistive element as a sixth embodiment of the present invention.

FIG. 6 is a sectional view showing a magnetoresistive element as another embodiment of the invention, taken from ABS side.

The magnetoresistive element shown in FIG. 6 is an anisotropic magnetoresistive (AMR) element and includes a laminate comprising, from the bottom, a soft magnetic layer (SAL layer) 52, a nonmagnetic layer (SHUNT layer) 53, and a magnetoresistive layer (MR layer) 54. The laminate constitutes a multilayer film 61, on both sides of which hard bias layers 56 and 56 are formed. Generally, the soft magnetic layer 52 is made of a Ni—Fe—Nb alloy film, the nonmagnetic layer 53 is made of a Ta film, the magnetoresistive layer 54 is made of a Ni—Fe alloy film, and the hard bias layer 56 is made of a Co—Pt alloy film.

Intermediate layers 57 and 57 each made of a nonmagnetic material are formed on the hard bias layers 56 and 56 on both sides of the multilayer film 61. In addition, electrode layers 140 and 140 are formed on the intermediate layers 57 and 57. The electrode layers 140 and 140 are each made of, for example, a film of Cr, Au, Ta, or W.

The magnetoresistive element shown in FIG. 6 also includes an insulating layer 141 made of, for example, $Al_2O_3$ and laminated on the multilayer film 61, and front end faces 140a and 140a of the electrode layers 140 and 140 are in contact with the both sides of the insulating layer 141.

According to the present embodiment, the front end faces 140a and 140a of the electrode layers 140 and 140 on the multilayer film 61 side are laminated so as to be along the sides of the insulating layer 141, and the thickness of the electrode layers 140 and 140 is kept thick even in regions where the electrode layers 140 and 140 are in contact with the multilayer film 61, owing to the thickness of the insulating layer 141. A sensing current can therefore be allowed to flow in the multilayer film 61 of the magnetoresistive element always at a constant level to thereby improve the reproducing characteristics.

By manufacturing the magnetoresistive element shown in FIG. 6 by the process mentioned below, the sides of the multilayer film 61 are put in parallel with the sides of the insulating layer 141.

A sensing region E and dead zones D and D of the multilayer film 61 are determined by the microtrack profiling technique also in the present embodiment. A region with a width T19 at the center of the multilayer film 61 is the sensing region E, and regions with a width T20 on both sides of the sensing region are the dead zones D and D.

As shown in FIG. 6, the electrode layers 140 and 140 extend to a top surface of the multilayer film 61, and the width of the top surface of the multilayer film 61 in a portion not covered by the electrode layers 140 and 140 is defined as an optical read track width O-Tw. The width of the sensing region of a portion not covered by the electrode layers 140 and 140 is defined as a magnetic read track width M-Tw. In the present embodiment, the electrode layers 140 and 140 extending over the multilayer film 61 completely cover the portions over the dead zones D and D. In this case, the optical read track width O-Tw is nearly identical in size to the magnetic read track width M-Tw.

Alternatively, the electrode layers 140 and 140 may not completely cover the portions over the dead zones D and D, and the width T71 of the electrode layers 140 and 140 extending over the multilayer film 61 may be shorter than the dead zones D and D. In this case, the optical read track width O-Tw is greater than the magnetic read track width M-Tw.

By the above configuration, a sensing current from the electrode layers 140 and 140 is facilitated to flow directly into the multilayer film 61 without the interposition of the hard bias layers 56 and 56. In addition, the electrode layers 140 and 140 extend even over the dead zones D and D to thereby increase junction areas between the multilayer film 61 and the electrode layers 140 and 140. The direct current resistance (DCR) can therefore be reduced to thereby improve the reproducing characteristics.

When the electrode layers 140 and 140 are formed so as to extend even over the dead zones D and D, the production of noises due to the sensing current separated and flown into the dead zones D and D can be inhibited.

In the embodiment shown in FIG. 6, the angle θ24 formed between the front end face 140a of the electrode layer 140 and the surface 54a of the antiferromagnetic layer 54 may be preferably set at 60 degrees or more, and more preferably at 90 degrees or more, which front end face 140a is in contact with the both sides of the insulating layer 141, and which electrode layer 140 extends over the dead zone of the multilayer film 61. By this configuration, a sensing current can be allowed to flow even to the end of the electrode layer 140 always at a constant level. Specifically, the production of noises due to the sensing current separated and flown into the dead zones D and D can be inhibited.

By manufacturing the magnetoresistive element of the present embodiment by the process mentioned below, the location of the insulating layer 141 on the multilayer film 61 can be accurately set to thereby prevent the electrode layer 140 from extending beyond the dead zone.

Specifically, the width T71 of the electrode layers 140 and 140 extending over the dead zones D and D of the multilayer film 61 is preferably more than 0 μm and equal to or less than 0.08 μm, and more preferably equal to or more than 0.05 μm and equal to or less than 0.08 μm.

In the embodiment shown in FIG. 6, the protective layer is not formed on a top surface of the multilayer film 61, and the insulating layer 141 is formed directly on the antiferromagnetic layer 54 and serves also as an antioxidant protective layer. In addition, the electrode layers 140 and 140 are directly joined with the antiferromagnetic layer 54.

The resulting magnetoresistive element can therefore have a lower electric resistance and improved characteristics than the case where the electrode layers 140 and 140 are laminated on the protective layer.

In this AMR element, the hard bias layers 56 and 56 are magnetized in the X direction, and the hard bias layers 56 and 56 supply a bias magnetic field to the magnetoresistive layer 54 in the X direction. In addition, the soft magnetic layer 52 supplies a bias magnetic field to the magnetoresistive layer 54 in the Y direction. By supplying bias magnetic fields to the magnetoresistive layer 54 in the X and Y directions, the magnetization vector in the magnetoresistive layer 54 linearly varies with the variation in magnetic field.

The sensing current from the electrode layers 140 and 140 is directly supplied to the magnetoresistive layer 54 in the sensing region. The magnetic recording medium moves in the Z direction and when the leakage magnetic field from the magnetic recording medium is applied in the Y direction, and the magnetization vector of the magnetoresistive layer 54 varies. The leakage magnetic field from the recording medium is thus detected by the variation in the voltage due to the variation in the electrical resistance.

By utilizing the process for manufacturing a magnetoresistive element as mentioned below, the hard bias layer has a small thickness in the vicinity of a plane in contact with the multilayer film, and the top surface of the hard bias layer is sloped or curved in the downward direction in the figure in the vicinity of the multilayer film, in the magnetoresistive elements shown in FIGS. 1 to 6.

If the top surface of the hard bias layer protrudes in the upward direction in the vicinity of the multilayer film as in the conventional magnetoresistive element shown in FIG. 14, a leakage magnetic field or loop of a magnetic field is generated in the protruded portion, and the magnetization vector in the free magnetic layer cannot be significantly stabilized.

In contrast, when the top surface of the hard bias layer is sloped or curved in the downward direction in the vicinity of the multilayer film as shown in FIGS. 1 to 6, the generation of leakage magnetic field or loop of a magnetic field can be prevented to thereby stabilize the magnetization vector in the free magnetic layer.

Each of the magnetoresistive elements shown in FIGS. 1 to 6 includes the insulating layer between the electrode layers and has a smooth top surface. When an upper shielding layer composed of a soft magnetic material is laminated on the multilayer film and the electrode layers, a short circuit between the electrode layer and the upper shield layer hardly occurs even if the angle formed between the surface of the protective layer, free magnetic layer or antiferromagnetic layer and the front end face of the electrode layer is increased.

By increasing the widths of the multilayer films 200, 201, 202, 203, and 61 of the magnetoresistive elements shown in FIGS. 2 to 6, the width of the sensing region E can be increased, which sensing region E is a region resistant to the effect of the hard bias layer and substantially exhibits the magnetoresistive effect. This is because the width of the dead zone D is set within a nearly constant range independently from the width of the top surface of the multilayer film 200, 201, 202, 203, or 61. The width of the sensing region E, i.e., the magnetic read track width M-Tw can be optionally set by optionally setting the width of the multilayer film 200, 201, 202, 203, or 61.

The process for manufacturing the magnetoresistive elements shown in FIGS. 1 to 6 will be described in detail with reference to the drawings.

Figure 7:
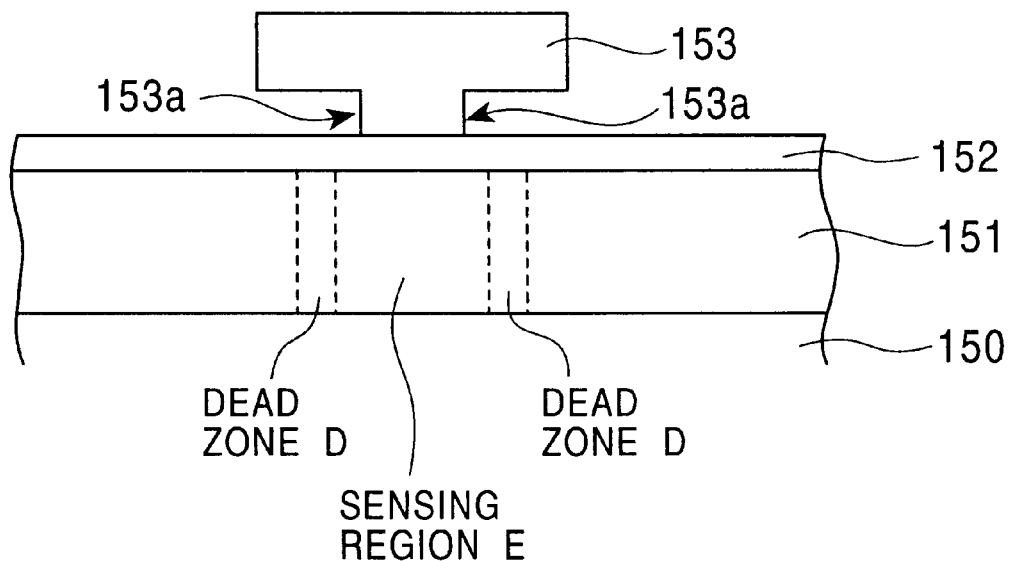
FIG. 7 is a process chart showing a step of the invented process for manufacturing the magnetoresistive element.

Initially, a multilayer film 151 of a magnetoresistive element is formed on a substrate 150, and an insulating layer 152 is then formed from, for example, $Al_2O_3$ on the multilayer film 151, as shown in FIG. 7. The multilayer film 151 can be any of a multilayer film of a single spin-valve thin film element as shown in FIGS. 1 to 4, a multilayer film of a dual spin-valve thin film element as shown in FIG. 5, and a multilayer film of an AMR element as shown in FIG. 6.

Figure 8:
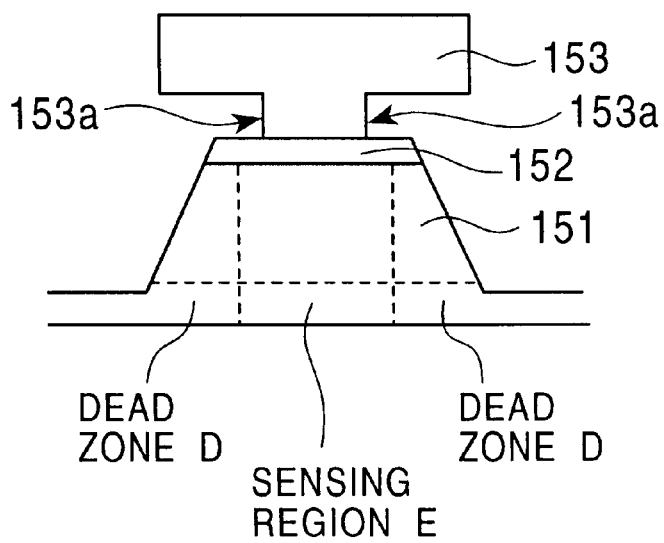
FIG. 8 is a process chart showing a step subsequent to the step shown in FIG. 7.

When the antiferromagnetic layer 70, 80, or 100 is formed long in the X direction as in the spin-valve thin film element shown in FIGS. 2, 3 or 5, an etching rate and an etching time may be controlled so as to keep the side of antiferromagnetic layer 70, 80, or 100 without cutting down in the step of cutting the sides of multilayer film 151 and the insulating layer 152 through etching operation shown in FIG. 8.

When the multilayer film 151 is made of a multilayer film of a single spin-valve thin film element or of a dual spin-valve thin film element, the antiferromagnetic layer constituting the multilayer film 151 is preferably made of a Pt—Mn alloy or an X—Mn alloy, where X is at least one element selected from Pd, Ir, Rh, and Ru, or a Pt—Mn—X' alloy, where X' is at least one element selected from Pd, Ir, Rh, Ru, Au, and Ag. When the antiferromagnetic layer is made of the above materials, a heat treatment (annealing) is necessary to generate an exchange coupling magnetic field at the interface between the antiferromagnetic layer and a pinned magnetic layer.

Separately, the width A of a top surface of a multilayer film of a conventional magnetoresistive element (e.g., FIG. 14) is previously determined with an optical microscope in the manner shown in FIG. 13, which conventional magnetoresistive element includes hard bias layers and electrode layers formed only on both sides of the multilayer film. Subsequently, the magnetoresistive element is allowed to scan in the track width direction on a microtrack in which a signal is recorded to detect a read output, and a region with a width B on the top surface of the multilayer film, which yields an output of 50% or more of the maximum read output is defined as a sensing region E, and a region with a width C on the top surface of the multilayer film, which yields an output less than 50% of the maximum read output is defined as a dead zone D.

Based on the determined results, a lift-off resist 153 is then formed on the insulating layer 152 in consideration of the width C of the dead zone D which has been previously determined by the microtrack profiling technique.

As shown in FIG. 7, the resist layer 153 includes incisions 153a and 153a formed at the bottom. The resist layer 153 serves as a mask in etching of the insulating layer 152 in a subsequent step. The resist layer 153 is laminated in such a manner that the bottom of the etched insulating layer 152 completely covers the sensing region E of the multilayer film 151. The incisions 153a and 153a are predominately formed over the dead zones D and D of the multilayer film 151. However, when the sides of the resist layer 153 become sloped surfaces after etching, the incisions 153a and 153a can extend over the sensing region E to some extent, in consideration of the sloped surfaces.

Next, both sides of the multilayer film 151 and the insulating layer 152 are etched in a step shown in FIG. 8.

Figure 9:
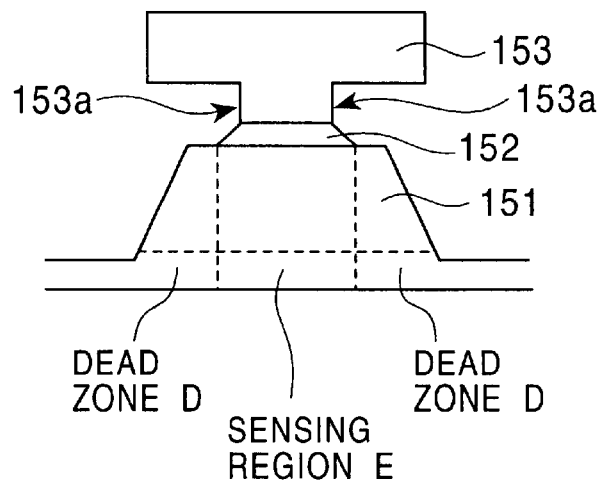
FIG. 9 is a process chart showing a step subsequent to the step shown in FIG. 8.

In a following step shown in FIG. 9, the insulating layer 152 alone, which is made of $Al_2O_3$, is etched with an alkali solution to thereby expose top surfaces of the dead zones D and D of the multilayer film 151. In this step, the individual layers constituting the multilayer film 151 are not dissolved by the alkali solution. The bottom of the insulating layer 152 completely covers the sensing region E of the multilayer film 151 in a state shown in FIG. 9.

When the insulating layer 152 made of $Al_2O_3$ is etched with an alkali solution, it is etched while keeping the sides of the insulating layer 152 in parallel with the sides of the multilayer film 151, and the sides of the insulating layer 152 and those of the multilayer film 151 are in parallel with each other after etching.

In the manufacture of the magnetoresistive element shown in FIG. 3, a protective layer is previously formed on a top surface of the multilayer film 151, and the insulating layer 152 and the resist layer 153 are sequentially laminated on the protective layer. In addition, the portions of the protective layer underlying the incisions 153a and 153a of the resist layer 153 and being not covered by the insulating layer 152 are removed by ion milling incident from an oblique direction to thereby expose an underlayer of the protective layer, after the step shown in FIG. 9.

Figure 10:
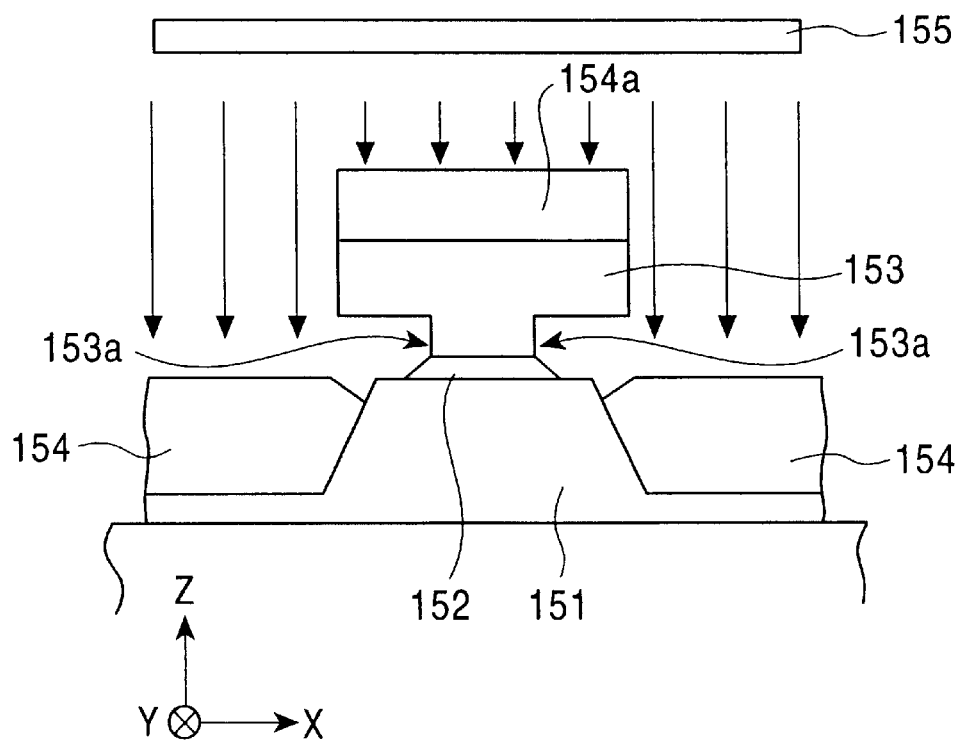
FIG. 10 is a process chart showing a step subsequent to the step shown in FIG. 9.

In a subsequent step shown in FIG. 10, hard bias layers 154 and 154 are formed on both sides of the multilayer film 151. In the present invention, the sputtering technique for use in the formation of the hard bias layers 154 and 154 and in the formation of electrode layer 156 in a subsequent step is preferably at least one selected from ion beam sputtering, long-throw sputtering, and collimation sputtering.

As shown in FIG. 10, the hard bias layers 154 and 154 can be formed in a direction perpendicular to the multilayer film 151, by placing the substrate 150 with the multilayer film 151 in a direction perpendicular to a target 155 having the same composition with that of the hard bias layers 154 and 154 and subjecting the substrate 150 to, for example, ion beam sputtering. The portions in the vicinity of the plane where the hard bias layers 154 and 154 are in contact with the multilayer film 151 are covered by the both ends of the resist layer 153, and sputtered particles are hardly deposited thereon. The portions in the vicinity of the plane where the hard bias layers 154 and 154 are in contact with the multilayer film 151 therefore have a small thickness, and top surfaces of the hard bias layers 154 and 154 are sloped or curved in the vicinity of the multilayer film 151 in the downward direction. A layer 154a having the same composition with that of the hard bias layer 154 is formed on the resist layer 153, as shown in FIG. 10.

In the step shown in FIG. 10, the hard bias layers 154 and 154 are preferably formed in such a manner that the height of an upper edge and/or a lower edge of a magnetic interface between the multilayer film 151 and the bias layers 154 and 154 in a direction in which a recording medium moves (in the Z direction) is equal to the height of an upper edge and/or a lower edge of the free magnetic layer or the magnetoresistive layer in the medium moving direction.

The hard bias layers 154 and 154 have only to be magnetically connected with the free magnetic layer or the magnetoresistive layer alone. Particularly; when the bias layers 154 and 154 are not magnetically connected with the pinned magnetic layer, a magnetic field generated from the bias layer can be prevented from the magnetization vector in the pinned magnetic layer.

In addition, when the free magnetic layer of the multilayer film 151 is composed of a laminate of plural soft magnetic thin film having different magnetic moments through the interposition of a nonmagnetic material layer as in the multilayer films of the thin film elements shown in FIGS. 2 to 5, the hard bias layers 154 and 154 are preferably formed in such a manner that the magnetic interfaces between the multilayer film 151 and the hard bias layers 154 and 154 overlap the sides of only one soft magnetic thin film, of sides of plural soft magnetic thin films constituting the free magnetic layer.

When the magnetic interfaces between the multilayer film 151 and the hard bias layers 154 and 154 overlap the sides with only one soft magnetic thin film, of sides of plural soft magnetic thin films constituting the free magnetic layer, the magnetization vectors at both ends of the soft magnetic thin film can be prevented from disordering.

Figure 11:
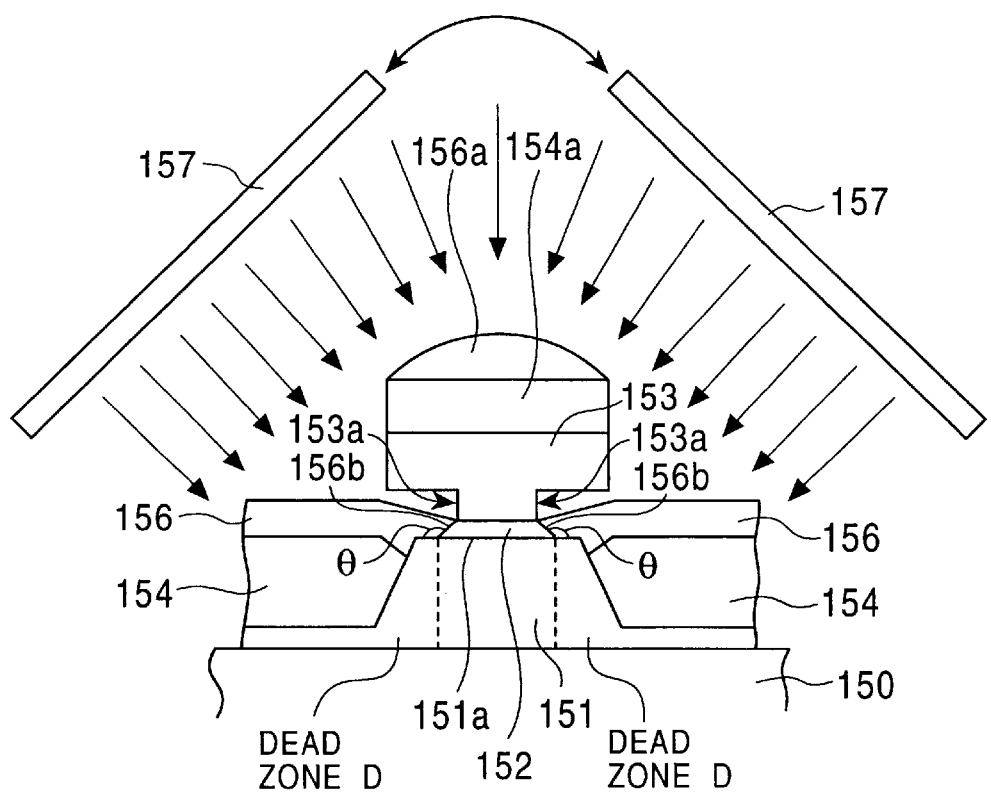
FIG. 11 is a process chart showing a step subsequent to the step shown in FIG. 10.

In a subsequent step shown in FIG. 11, electrode layers 156 and 156 are formed on the hard bias layers 154 and 154 from an oblique direction with respect to the multilayer film 151. In this step, the electrode layers 154 and 154 are formed even inside the incisions 153a and 153a formed at the bottom of the resist layer 153.

For example as shown in FIG. 11, a target 157 having the same composition with that of the electrode layer 156 is placed in an oblique direction with respect to the substrate 150 with the multilayer film 151, and then the electrode layers 156 and 156 are formed on the hard bias layers 154 and 154 by ion beam sputtering, while moving the target 157 over the substrate 150. In this step, the electrode layer 156 sputtered from an oblique direction not only deposits on the hard bias layers 154 and 154 but also enters inside the incision 153a of the resist layer 153 formed on the insulating layer 152.

Specifically, the electrode layers 156 and 156 formed inside the incisions 153a and 153a locate so as to cover the dead zones D and D of the multilayer film 151.

In addition, the front end faces 156b and 156b of the electrode layers 156 and 156 are in contact with the both sides of the insulating layer 152.

In the embodiment shown in FIG. 11, the substrate 150 is fixed and the target 157 is moved in an oblique direction with respect to the substrate 150. Alternatively, the target 157 may be fixed and the substrate 150 may be moved in an oblique direction with respect to the target 157. A layer 156a having the same composition with that of the electrode layer 156 is formed on the layer 154a on the resist layer 153, as shown in FIG. 11.

When the underlayer of the protective layer formed on the top surface of the multilayer film 151 is exposed, the electrode layers 156 and 156 are formed on the free magnetic layer which underlies the protective layer, as in the thin film magnetic element shown in FIG. 3.

Figure 12:
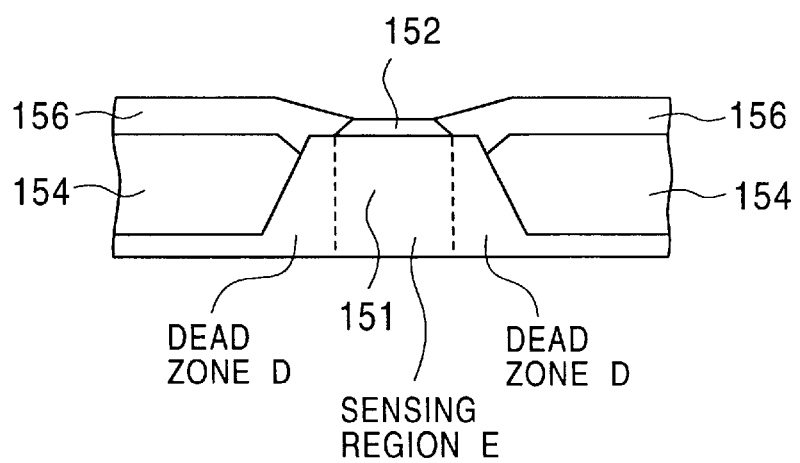
FIG. 12 is a process chart showing a step subsequent to the step shown in FIG. 11.

In a subsequent step shown in FIG. 12, the resist layer 153 shown in FIG. 11 is removed by lift-off technique using a resist stripping solution to thereby form the electrode layers 156 and 156 even on the portions over the dead zones D and D in the multilayer film 151. Thus, a magnetoresistive element including the insulating layer formed between the electrode layers 156 and 156 is obtained.

In the step of forming the electrode layers 156 and 156, the angle θ formed between the front end face 156b of the electrode layer 156 and the surface 151a of the antiferromagnetic layer 151 can be set at 60 degrees or more, and more preferably at 90 degrees or more, which front end face 156b is in contact with the portions on both sides of the insulating layer 152, and which electrode layer 156 extends over the dead zone D of the multilayer film 151. By this configuration, a sensing current can be allowed to flow even to the end of the electrode layer 156 always at a constant level. Specifically, the resulting magnetoresistive element can effectively inhibit the production of noises due to the sensing current separated and flown into the dead zone, as in the magnetoresistive elements shown in FIGS. 1 to 6.

According to this process, the location of the insulating layer 152 on the multilayer film 151 can be accurately set to thereby prevent the electrode layers 156 and 156 from extending beyond the dead zones. Thus, a region where the magnetoresistive element can actually detect a magnetic field can be maintained wide.

In the manufacture of the magnetoresistive element shown in FIG. 1, the step of etching the insulating layer 152 with an alkali solution is not necessary.

According to the present invention as described in detail above, an insulating layer is formed between the electrode layers on both sides of the multilayer film of the magnetoresistive element, and the electrode layers are in contact with sides of the insulating layer directly or through the interposition of another layer, and the thickness of the electrode layers can be kept thick even in regions where the electrode layers are joined with the multilayer film, owing to the thickness of the insulating layer. Accordingly, a sensing current can be allowed to flow in the multilayer film of the magnetoresistive element always at a constant level to thereby improve the reproducing characteristics.

The location of the insulating layer on the multilayer film of the invented magnetoresistive element can be accurately set to thereby prevent the electrode layers from extending beyond the dead zones on the multilayer film.

Other embodiments and variations will be obvious to those skilled in the art, and this invention is not to be limited to the specific matters stated above.

What is claimed is:

1. A magnetoresistive element comprising:
    a multilayer film comprising an antiferromagnetic layer, a pinned magnetic layer formed in contact with said antiferromagnetic layer, the magnetization vector in said pinned magnetic layer being fixed by an exchange anisotropic magnetic field with said antiferromagnetic layer, and a free magnetic layer formed on said pinned magnetic layer through the interposition of a nonmagnetic layer;
    a pair of bias layers formed on both sides of said multilayer film and aligning the magnetization vector in said free magnetic layer to a direction crossing the magnetization vector of said pinned magnetic layer;
    a pair of electrode layers formed on said bias layers and supplying a sensing current to said pinned magnetic layer, said nonmagnetic layer and said free magnetic layer; and
    an insulating layer formed on said multilayer film between said pair of electrode layers, said pair of electrode layers being in direct contact with both sides of said insulating layer.

2. A magnetoresistive element according to claim 1, wherein said multilayer film comprises a lamination of said antiferromagnetic layer, said pinned magnetic layer, said nonmagnetic layer, and said free magnetic layer in this order from the bottom, said antiferromagnetic layer extends toward the portions on both sides of each of said layers formed on said antiferromagnetic layer, and said pair of bias layers and said pair of electrode layers are laminated onto said antiferromagnetic layer in the both side regions through the interposition of a metallic film.

3. A magnetoresistive element according to claim 1, wherein an antioxidant protective layer is formed on a top surface of said multilayer film.

4. A magnetoresistive element according to claim 3, wherein a surface of said protective layer or a surface of said multilayer film other than said protective layer forms an angle of 60 degrees or more with front end faces of said electrode layers extending over a dead zone of said multilayer film.

5. A magnetoresistive element according to claim 3, wherein a surface of said protective layer or a surface of said multilayer film other than said protective layer forms an angle of 90 degrees or more with front end faces of said electrode layers extending over a dead zone of said multilayer film.

6. A magnetoresistive element according to claim 1, wherein said free magnetic layer comprises plural soft magnetic thin films having different magnetic moments and being laminated with each other through the interposition of a nonmagnetic material layer, and said free magnetic layer is in a ferrimagnetic state where the magnetization vectors in a pair of said soft magnetic thin films adjacent to each other through the interposition of said nonmagnetic material layer are in parallel with and opposite to each other.

7. A magnetoresistive element according to claim 6, wherein a magnetic interface between said multilayer film and said bias layer overlays a side of only one soft magnetic thin film, of sides of said plural soft magnetic thin films constituting said free magnetic layer.

8. A magnetoresistive element according to claim 1, wherein said pinned magnetic layer comprises plural soft magnetic thin films having different magnetic moments and being laminated with each other through the interposition of a nonmagnetic material layer, and said pinned magnetic layer is in a ferrimagnetic state where the magnetization vectors in a pair of said soft magnetic thin films adjacent to each other through the interposition of said nonmagnetic material layer are in parallel with and opposite to each other.

9. A magnetoresistive element according to claim 6, wherein said nonmagnetic material layer is made of one metal or of an alloy of two or more metals selected from the group consisting of Ru, Rh, Ir, Cr, Re, and Cu.

10. A magnetoresistive element according to claim 1, wherein said antiferromagnetic layer is made of a Pt—Mn alloy.

11. A magnetoresistive element according to claim 1, wherein said antiferromagnetic layer is made of an X—Mn alloy, wherein X is at least one element selected from the group consisting of Pd, Ir, Rh, and Ru.

12. A magnetoresistive element according to claim 1, wherein said antiferromagnetic layer is made of a Pt—Mn—X' alloy, wherein X' is at least one element selected from the group consisting of Pd, Ir, Rh, Ru, Au, and Ag.

13. A magnetoresistive element according to claim 1, wherein the height of an upper edge and/or a lower edge of a magnetic interface between said multilayer film and said bias layer in a direction in which a medium moves is equal to the height of an upper side and/or a lower side of said free magnetic layer in the medium moving direction.

14. A magnetoresistive element according to claim 1, wherein said multilayer film comprises a sensing region at the center and dead zones formed on both sides of said sensing region, said sensing region having a satisfactory reproducing sensitivity and being capable of substantially exhibiting a magnetoresistive effect, and said dead zones having a poor reproducing sensitivity and being not capable of substantially exhibiting a magnetoresistive effect, and wherein said electrode layers formed on both sides of said multilayer film are extend over the dead zones of said multilayer film.

15. A magnetoresistive element according to claim 14, wherein said sensing region of said multilayer film is defined as a region which yields an output of 50% or more of the maximum read output, and the dead zones of said multilayer film are defined as regions which are on both sides of said sensing region and yield an output less than 50% of the maximum read output, as determined by allowing a magnetoresistive element comprising electrode layers formed only on both sides of the multilayer film to scan on a microtrack with a recorded signal in a track width direction.

16. A magnetoresistive element according to claim 3, wherein said protective layer is formed on said multilayer film in a portion which is not joined with said electrode layers.

17. A magnetoresistive element according to claim 14, wherein said sensing region of said multilayer film has an equal width to an optical read track width O-Tw.

18. A magnetoresistive element according to claim 14, wherein the width of each of said electrode layers in a portion extending over said multilayer film is more than 0 μm and equal to or less than 0.08 μm.

19. A magnetoresistive element according to claim 18, wherein the width of each of said electrode layers in a portion extending over said multilayer film is equal to or more than 0.05 μm.

20. A magnetoresistive element according to claim 1, wherein a side of said multilayer film is in parallel with a side of said insulating layer.

21. A magnetoresistive element comprising:
   a multilayer film including a free magnetic layer, nonmagnetic layers formed on and under said free magnetic layer, pinned magnetic layers formed on one nonmagnetic layer and under the other nonmagnetic layer, the magnetization vectors in said pinned magnetic layers being fixed, and antiferromagnetic layers formed on one pinned magnetic layer and under the other pinned magnetic layer;
   a pair of bias layers formed on both sides of multilayer film and aligning the magnetization vector in a direction crossing the magnetization vector in said pinned magnetic layer;
   a pair of electrode layers formed on said bias layers and supplying a sensing current to said pinned magnetic layers, said nonmagnetic layers, and said free magnetic layer; and
   an insulating layer being formed on said multilayer film between said pair of electrode layers, said pair of electrode layers being in direct contact with both sides of said insulating layer.

22. A magnetoresistive element according to claim 21, wherein an antioxidant protective layer is formed on a top surface of said multilayer film.

23. A magnetoresistive element according to claim 22, wherein a surface of said protective layer or a surface of said multilayer film other than said protective layer forms an angle of 60 degrees or more with front end faces of said electrode layers extending over a dead zone of said multilayer film.

24. A magnetoresistive element according to claim 22, wherein a surface of said protective layer or a surface of said multilayer film other than said protective layer forms an angle of 90 degrees or more with front end faces of said electrode layers extending over a dead zone of said multilayer film.

25. A magnetoresistive element according to claim 21, wherein said antiferromagnetic layer is made of a Pt—Mn alloy.

26. A magnetoresistive element according to claim 21, wherein said antiferromagnetic layer is made of an X—Mn alloy, wherein X is at least one element selected from the group consisting of Pd, Ir, Rh, and Ru.

27. A magnetoresistive element according to claim 21, wherein said antiferromagnetic layer is made of a Pt—Mn—X' alloy, wherein X' is at least one element selected from the group consisting of Pd, Ir, Rh, Ru, Au, and Ag.

28. A magnetoresistive element according to claim 21, wherein the height of an upper edge and/or a lower edge of a magnetic interface between said multilayer film and said bias layer in a direction in which a medium moves is equal to the height of an upper side and/or a lower side of said free magnetic layer in the medium moving direction.

29. A magnetoresistive element according to claim 21, wherein said multilayer film comprises a sensing region at the center and dead zones formed on both sides of said sensing region, said sensing region having a satisfactory reproducing sensitivity and being capable of substantially exhibiting a magnetoresistive effect, and said dead zones having a poor reproducing sensitivity and being not capable of substantially exhibiting a magnetoresistive effect, and wherein said electrode layers formed on both sides of said multilayer film extend over the dead zone of said multilayer film.

30. A magnetoresistive element according to claim 29, wherein said sensing region of said multilayer film is defined as a region which yields an output of 50% or more of the maximum read output, and the dead zones of said multilayer film are defined as regions which are on both sides of said sensing region and yield an output less than 50% of the maximum read output, as determined by allowing a magnetoresistive element comprising electrode layers formed only on both sides of the multilayer film to scan on a microtrack with a recorded signal in a track width direction.

31. A magnetoresistive element according to claim 22, wherein said protective layer is formed on said multilayer film in a portion which is not joined with said electrode layers.

32. A magnetoresistive element according to claim 29, wherein said sensing region of said multilayer film has an equal width to an optical read track width O-Tw.

33. A magnetoresistive element according to claim 29, wherein the width of each of said electrode layers in a portion extending over said multilayer film is more than 0 μm and equal to or less than 0.08 μm.

34. A magnetoresistive element according to claim 33, wherein the width of each of said electrode layers in a portion extending over said multilayer film is equal to or more than 0.05 μm.

35. A magnetoresistive element according to claim 21, wherein a side of said multilayer film is in parallel with a side of said insulating layer.

36. A magnetoresistive element comprising:
   a multilayer film including a magnetoresistive layer, a nonmagnetic layer, and a soft magnetic layer laminated in this order;
   a pair of bias layers formed on both sides of said multilayer film; and
   a pair of electrode layers formed on said bias layers, and an insulating layer formed between said electrode layers, said electrode layers formed on both sides of said multilayer film being in contact with the sides of said insulating layer directly.

37. A magnetoresistive element according to claim 36, wherein the height of an upper edge and/or a lower edge of a magnetic interface between said multilayer film and said bias layer in a direction in which a medium moves is equal to the height of an upper side and/or a lower side of said magnetoresistive layer in the medium moving direction.

38. A magnetoresistive element according to claim 36, wherein said multilayer film comprises a sensing region at the center and dead zones formed on both sides of said sensing region, said sensing region having a satisfactory reproducing sensitivity and being capable of substantially exhibiting a magnetoresistive effect, and said dead zones having a poor reproducing sensitivity and being not capable of substantially exhibiting a magnetoresistive effect, and wherein said electrode layers formed on both sides of said multilayer film extend over the dead zone of said multilayer film.

39. A magnetoresistive element according to claim 38, wherein said sensing region of said multilayer film is defined as a region which yields an output of 50% or more of the maximum read output, and said dead zones of said multilayer film are defined as regions which are on both sides of said sensing region and yield an output less than 50% of the maximum read output, as determined by allowing a magnetoresistive element comprising electrode layers formed only on both sides of the multilayer film to scan on a microtrack with a recorded signal in a track width direction.

40. A magnetoresistive element according to claim 36, wherein a protective layer is formed on said multilayer film in a portions which is not joined with said electrode layers.

41. A magnetoresistive element according to claim 38, wherein said sensing region of said multilayer film has an equal width to an optical read track width O-Tw.

42. A magnetic head comprising the magnetoresistive element of claim 1.

43. A magnetic head comprising the magnetoresistive element of claim 21.

44. A magnetic head comprising the magnetoresistive element of claim 36.

45. A magnetoresistive element according to claim 1, wherein said insulating layer has a width that is smaller than that of said multilayer film, and wherein said pair of electrode layers are in direct contact with both sides of said multilayer film.

46. A magnetoresistive element according to claim 1, wherein said pair of electrode layers are in direct contact with both sides of said multilayer film.

47. A magnetoresistive element according to claim 21, wherein said insulating layer has a width that is smaller than that of said multilayer film, and wherein said pair of electrode layers are in direct contact with both sides of said multilayer film.

48. A magnetoresistive element according to claim 21, wherein said pair of electrode layers are in direct contact with both sides of said multilayer film.

* * * * *